US012787605B2

(12) United States Patent
Kim et al.

(10) Patent No.: US 12,787,605 B2

(45) Date of Patent: Nov. 3, 2026

(54) DISPLAY DEVICE WITH PORTION OF DISPLAY AREA OVERLAPPING SCAN DRIVER

(71) Applicant: Samsung Display Co., LTD., Yongin-si (KR)

(72) Inventors: Sun Ho Kim, Seongnam-si (KR); Yoo Min Ko, Suwon-si (KR); Ju Chan Park, Seoul (KR); Pil Suk Lee, Suwon-si (KR); Hye Won Kim, Seoul (KR); Chung Sock Choi, Seoul (KR); Sung Jin Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 960 days.

(21) Appl. No.: 17/960,219

(22) Filed: Oct. 5, 2022

(65) Prior Publication Data

US 2023/0200158 A1 Jun. 22, 2023

(30) Foreign Application Priority Data

Dec. 21, 2021 (KR) ........................ 10-2021-0183945

(51) Int. Cl.

| | |
|---|---|
| ***H01L 27/32*** | (2006.01) |
| ***H01L 51/52*** | (2006.01) |
| ***H10K 59/122*** | (2023.01) |
| ***H10K 59/131*** | (2023.01) |
| ***H10K 59/80*** | (2023.01) |

(52) U.S. Cl.

CPC ......... *H10K 59/873* (2023.02); *H10K 59/122* (2023.02); *H10K 59/131* (2023.02)

(58) Field of Classification Search

CPC .................................................... H10K 59/873

See application file for complete search history.

(56) References Cited

U.S. PATENT DOCUMENTS

| | | | | |
|---|---|---|---|---|
| 2021/0265436 | A1* | 8/2021 | Jeon | H10K 59/131 |
| 2022/0028938 | A1* | 1/2022 | Zhao | H10K 59/131 |
| 2022/0320236 | A1* | 10/2022 | Dai | H10K 59/131 |

FOREIGN PATENT DOCUMENTS

| | | |
|---|---|---|
| KR | 10-2016-0032798 | 3/2016 |
| KR | 10-2019-0073773 | 6/2019 |
| KR | 10-2020-0081990 | 7/2020 |
| KR | 10-2021-0107218 A | 9/2021 |
| KR | 10-2022-0027351 | 3/2022 |

* cited by examiner

*Primary Examiner* — Peter Bradford

(74) *Attorney, Agent, or Firm* — F. CHAU & ASSOCIATES, LLC

(57) ABSTRACT

A display device includes a substrate including a first display area; a peripheral area; and a second display area disposed between the first display area and the peripheral area; a first light-emitting device disposed on the first display area of the substrate; a second light-emitting device disposed on the second display area of the substrate; a driving circuit disposed on the second display area and the peripheral area of the substrate and overlapping the second light-emitting device in a plan view; a pattern portion disposed on the driving circuit; and a dam disposed on an outside of the pattern portion.

20 Claims, 13 Drawing Sheets

DISPLAY DEVICE WITH PORTION OF DISPLAY AREA OVERLAPPING SCAN DRIVER

CROSS-REFERENCE TO RELATED APPLICATION(S)

This application claims priority to and benefits of Korean Patent Application No. 10-2021-0183945 filed on Dec. 21, 2021 in the Korean Intellectual Property Office, the entire contents of which are incorporated herein by reference.

BACKGROUND

1. Technical Field

The disclosure relates to a display device.

2. Description of the Related Art

A display device displays images on a screen and may include a liquid crystal display (LCD) and an organic light emitting diode (OLED) display. The display device is used for various electronic devices such as a portable phone, a GPS, a digital camera, an electronic book, a portable game device, or various terminals.

The display device may include a display area for displaying images and a peripheral area for displaying no images. Pixels may be disposed in a row direction and a column direction in the display area. Various elements such as transistors or capacitors and various wires for supplying signals to them may be positioned in the respective pixels. Various wires for transmitting electrical signals for driving the pixels, a scan driver, a data driver, and a controller may be positioned in the peripheral area.

Demands for reducing a size of the peripheral area and increasing the display area are increasing, but an area occupied by the driver may increase for a process for realizing high resolution and high-rate driving, so it is difficult to reduce the size of the peripheral area.

The above information disclosed in this background section is only for enhancement of understanding of the background of the described technology, and therefore it may contain information that does not form the prior art that may already be known to a person of ordinary skill in the art.

SUMMARY

The described technology has been made in an effort to provide a display device with an extended display area.

The described technology has been made in an effort to provide a display device with an extended display area for preventing a generation of connection defects of wires.

A display device may include a substrate including a first display area; a peripheral area; and a second display area disposed between the first display area and the peripheral area; a first light-emitting device disposed on the first display area of the substrate; a second light-emitting device disposed on the second display area of the substrate; a driving circuit disposed on the second display area and the peripheral area of the substrate and overlapping the second light-emitting device in a plan view; a pattern portion disposed on the driving circuit; and a dam disposed on an outside of the pattern portion.

The display device may further include an emission layer disposed on the first display area and the second display area of the substrate; and a common electrode disposed on the emission layer, wherein the pattern portion may include a first pattern portion overlapping an end portion of the emission layer in the plan view, and a second pattern portion overlapping an end portion of the common electrode in the plan view.

The display device may further include a common voltage supplying line disposed on the peripheral area of the substrate; and an extension electrode electrically connecting the common voltage supplying line and the common electrode, wherein the extension electrode and the common electrode electrically contact each other in a region between the first pattern portion and the second pattern portion.

The extension electrode may overlap the common voltage line, the first pattern portion, and the second pattern portion in the plan view.

The display device may further include an encapsulation layer disposed on the substrate, wherein the encapsulation layer may include a first inorganic encapsulation layer; a second inorganic encapsulation layer; and an organic encapsulation layer disposed between the first inorganic encapsulation layer and the second inorganic encapsulation layer, and the organic encapsulation layer may cover the pattern portion.

The organic encapsulation layer may cover an upper side and a lateral side of the pattern portion, and the organic encapsulation layer may not cover an upper side of the dam.

The dam may include a first dam overlapping the common voltage supplying line in the plan view; and a second dam disposed on an outside of the first dam, and the organic encapsulation layer may cover a lateral side of the first dam.

The first inorganic encapsulation layer and the second inorganic encapsulation layer may cover the pattern portion and the dam.

A width of the first pattern portion may be equal to or greater than about 15 μm and equal to or less than about 50 μm, and a width of the second pattern portion may be equal to or greater than about 15 μm and equal to or less than about 50 μm.

A distance between the first pattern portion and the second pattern portion may be equal to or greater than about 70 μm.

The second pattern portion may be disposed further outside than the first pattern portion.

The second pattern portion may be disposed between the first pattern portion and the dam.

The display device may further include a first pixel circuit disposed on the first display area of the substrate; and a first pixel electrode electrically connected to the first pixel circuit, wherein the first light-emitting device may include the first pixel electrode, the emission layer, and the common electrode, and a light emitting region of the first light-emitting device may overlap the first pixel circuit unit electrically connected to the first light-emitting device.

The display device may further include a second pixel circuit disposed on the second display area of the substrate; and a second pixel electrode electrically connected to the second pixel circuit, wherein the second light-emitting device may include the second pixel electrode, the emission layer, and the common electrode, and a light emitting region of the second light-emitting device may not overlap the second pixel circuit electrically connected to the second light-emitting device in the plan view.

The display device may further include a bank layer disposed on the first pixel electrode and the second pixel electrode, and including a pixel opening overlapping the first pixel electrode and the second pixel electrode in the plan view; and a spacer disposed on the bank layer, wherein the pattern portion, the bank layer, and the spacer may include a same material.

The display device may further include passivation layers disposed below the first pixel electrode and the second pixel electrode and including an organic material, wherein the pattern portion and the passivation layers may include a same material.

An end portion of the emission layer may be disposed on a center portion of an upper side of the first pattern portion, and an end portion of the common electrode may be disposed on a center portion of an upper side of the second pattern portion.

The substrate may include pixels, the emission layer may include an individual emission layer separated and disposed on respective pixels, and a common layer disposed to be connected to the pixels; and an end portion of the common layer of the emission layer may be disposed on the first pattern portion.

The common layer of the emission layer and the common electrode may be formed by a deposition method using an open mask.

The first pattern portion and the second pattern portion may be respectively disposed near an edge of the substrate, and may have a bar shape extending in parallel to the edge of the substrate in the plan view.

According to the embodiments, the display area with an extended display device may be provided.

Further, generation of connection defects of wires may be prevented from the display device with an extended display area.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
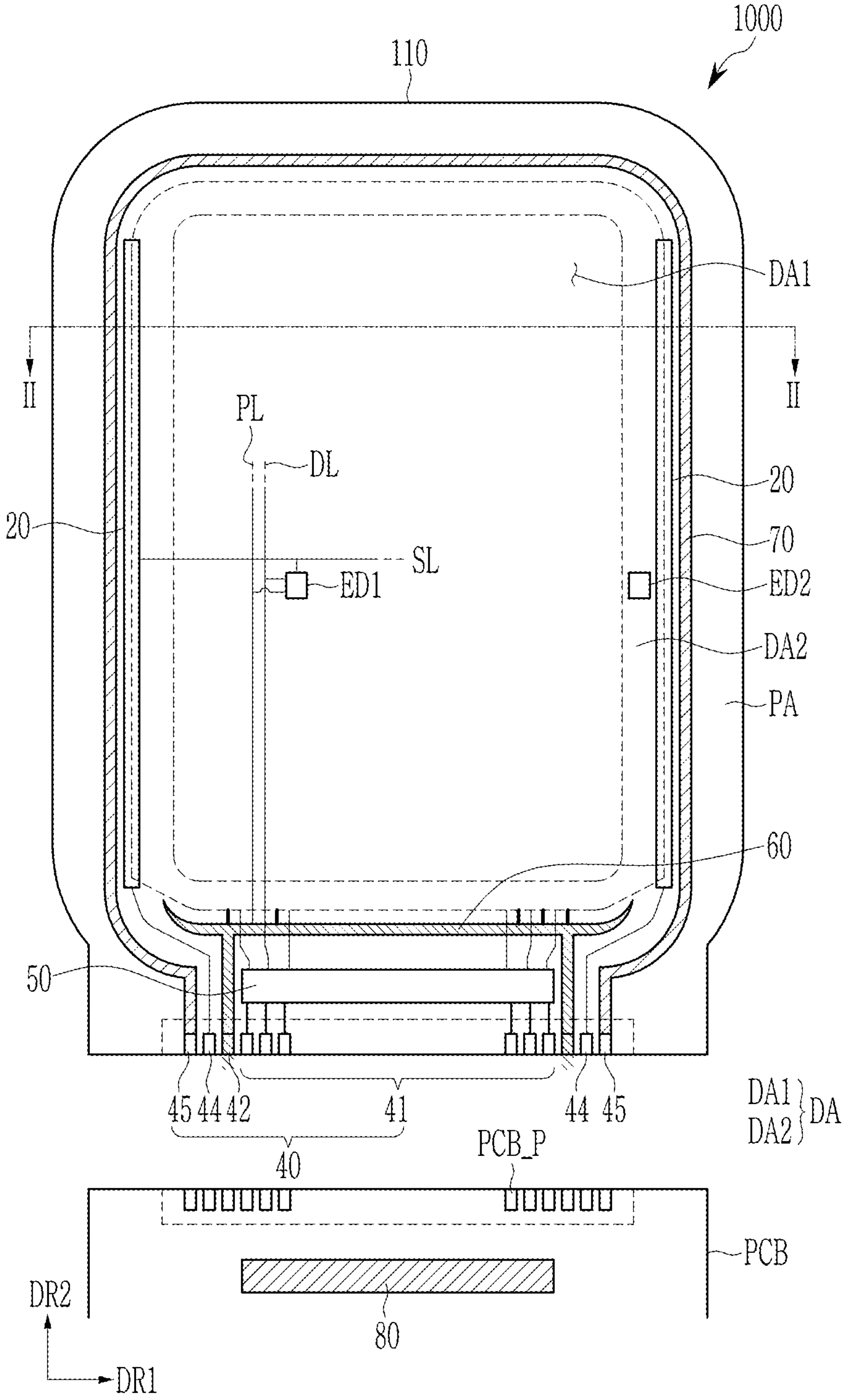
FIG. 1 shows a schematic top plan view of a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

Parts that may be irrelevant to the description may be omitted to clearly describe the disclosure, and like reference numerals designate like elements throughout the specification. In the drawings, the thickness of layers, films, panels, regions, etc., may be enlarged for clarity. For ease of description, the thicknesses of some (or a number of) layers and areas may be exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In the specification, the word "on" or "above" means disposed on or below the object portion, and does not necessarily mean disposed on the upper side of the object portion based on a gravitational direction.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing a target portion from the top, and the phrase "in a schematic cross-sectional view" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display device according to an embodiment will now be described with reference to FIG. 1 and FIG. 2.

Figure 2:
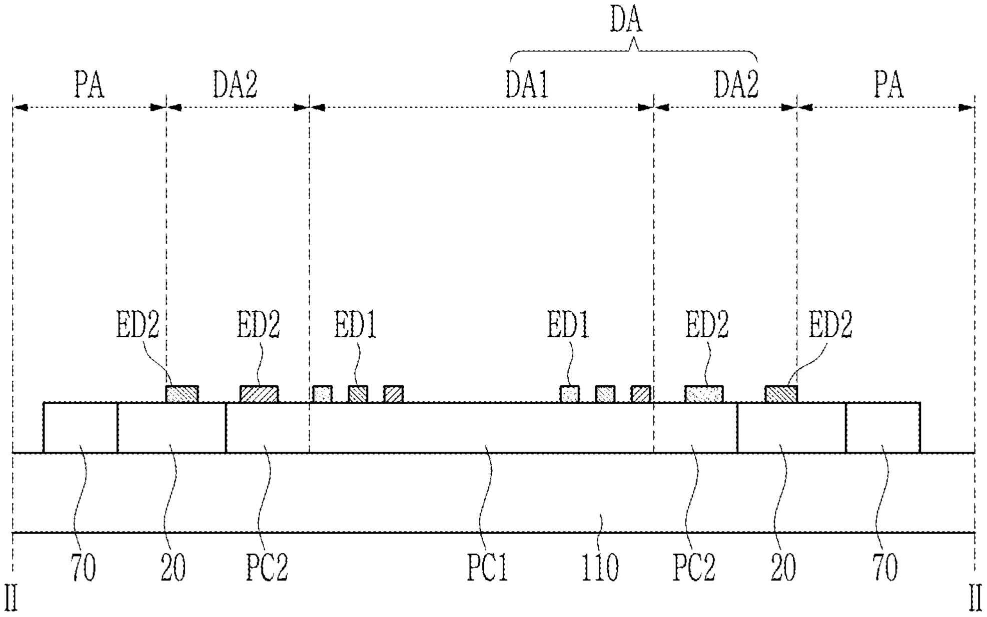
FIG. 2 shows a schematic cross-sectional view with respect to line II-II of FIG. 1.

FIG. 1 shows a schematic top plan view of a display device according to an embodiment, and FIG. 2 shows a schematic cross-sectional view with respect to line II-II of FIG. 1.

As shown in FIG. 1 and FIG. 2, the display device 1000 may include a substrate 110, and light-emitting devices ED1 and ED2 positioned on the substrate 110.

The substrate 110 may include a display area DA, and a peripheral area PA disposed near the display area DA.

The display area DA may be positioned in a center portion of the display device 1000, it may have a substantially quadrangular shape, and a corner may have a round or a substantially round shape. The display area DA may display images, and may include a first display area DA1 and a second display area DA2.

The first display area DA1 may be positioned in a center of the display area DA, and may occupy most of the display area DA.

The second display area DA2 may be positioned near the first display area DA1. The second display area DA2 may be positioned on a left side and a right side, for example, respective sides of the first display area DA1. The second display area DA2 may be further positioned on an upper side and a lower side of the first display area DA1. However, this is not limited thereto, and the second display area DA2 may be positioned on one side or a side of the first display area DA1. The second display area DA2 may be positioned between the first display area DA1 and the peripheral area PA.

The peripheral area PA may surround or may be adjacent to the display area DA. The peripheral area PA may display no images, and may be positioned on an exterior part of the display device.

The light-emitting devices ED1 and ED2 may be positioned in the display area DA of the substrate 110, and may be electrically connected to signal lines PL, DL, and SL. The respective light-emitting devices ED1 and ED2 may, for example, emit red, green, blue, or white light. The display area DA may provide images through light emitted by the light-emitting devices ED1 and ED2. The light-emitting devices ED1 and ED2 may include a first light-emitting device ED1 and a second light-emitting device ED2. The first light-emitting device ED1 may be positioned in the first display area DA1, and the second light-emitting device ED2 may be positioned in the second display area DA2.

The display device 1000 may further include pixel circuit units PC1 and PC2 disposed on the substrate 110. The pixel circuit units PC1 and PC2 may include a first pixel circuit unit (or first pixel circuit) PC1 and a second pixel circuit unit (or a second pixel circuit) PC2. The first pixel circuit unit PC1 represents a region in which first pixel circuit units PC1 are substantially arranged or disposed in a matrix form, and the second pixel circuit unit PC2 represents a region in which second pixel circuit units PC2 are substantially arranged or disposed in a matrix form. The arranged forms of pixels circuit units are not specifically limited thereto, and may be various. For example, the pixels circuit units may not be orthogonal to each other and may traverse each other in an inclined direction. An area of first pixel circuit units PC1 may be greater than an area of second pixel circuit units PC2. The respective pixel circuit units PC1 and PC2 may be connected to one of the light-emitting devices ED1 and ED2. The first pixel circuit unit PC1 may be connected to the first light-emitting device ED1, and the second pixel circuit unit PC2 may be connected to the second light-emitting device ED2. However, without being limited thereto, the respective pixel circuit units PC1 and PC2 may be connected to light-emitting devices ED1 and ED2. For example, one second pixel circuit unit PC2 may be connected to two second light-emitting devices ED2.

The area of one first pixel circuit unit PC1 may be different from that of the second pixel circuit unit PC2. For example, the first pixel circuit unit PC1 and the second pixel circuit unit PC2 may have a same length, and the first pixel circuit unit PC1 and the second pixel circuit unit PC2 may have different widths. In another way, the first pixel circuit unit PC1 and the second pixel circuit unit PC2 may have a same width, and the first pixel circuit unit PC1 and the second pixel circuit unit PC2 may have different lengths. In another way, the first pixel circuit unit PC1 and the second pixel circuit unit PC2 may have different lengths and widths. The area of the second pixel circuit unit PC2 may be greater than the area of the first pixel circuit unit PC1. For example, the area of the second pixel circuit unit PC2 may be about twice the area of the first pixel circuit unit PC1.

The display device 1000 may further include a driving circuit unit (or driving circuit), and the driving circuit unit may include drivers and signal wires. For example, the driving circuit unit may include a scan driver 20, a data driver 50, a driving voltage supplying line 60, a common voltage supplying line 70, and signal transmitting wires connected thereto. At least part of the driving circuit unit may be positioned in the second display area DA2, and the residual thereof may be positioned in the peripheral area PA.

The scan driver 20 generates scan signals and transmits the same to the pixel circuit units PC1 and PC2 electrically connected to the light-emitting devices ED1 and ED2 through the scan line SL. The scan driver 20 may be disposed on the left side and the right side of the first display area DA1. The specification shows a configuration in which the scan driver 20 is disposed on respective sides of the substrate 110, and as an embodiment, the scan driver may be disposed on one side or a side of the substrate 110.

The pad portion 40 is disposed on one end portion of the substrate 110, and may include terminals 41, 42, 44, and 45. The pad portion 40 may not be covered by the insulating layer and may be exposed, and may be electrically connected to the printed circuit board PCB. The pad portion 40 may be electrically connected to a pad portion PCB_P of the printed circuit board PCB. The printed circuit board PCB may transmit signals of an IC driving chip 80 or a power voltage to the pad portion 40.

A controller changes image signals transmitted from an outside into image data signals, and transmits the changed signals to the data driver 50 through the terminal 41. The controller may receive a vertical synchronization signal, a horizontal synchronizing signal, and a clock signal, may generate a control signal for controlling the scan driver 20 and the data driver 50, and may transmit the control signal to elements through the terminals 44 and 41. The controller transmits a driving voltage ELVDD to the driving voltage supplying line 60 through the terminal 42. The controller transmits a common voltage ELVSS to the common voltage supplying lines 70 through the terminal 45.

The data driver 50 may be disposed on the peripheral area PA, and generates data signals and transmits the same to the pixel circuit units PC1 and PC2 connected to the respective light-emitting devices ED1 and ED2 through the data line (DL). The data driver 50 may be disposed on one side or a side of a display panel DP, for example, it may be disposed between the pad portion 40 and the display area DA.

The driving voltage supplying line 60 may be disposed on the peripheral area PA. For example, the driving voltage supplying line 60 may be disposed between the data driver 50 and the display area DA. The driving voltage supplying line 60 provides the driving voltage ELVDD to the pixel circuit units PC1 and PC2 connected to the light-emitting devices ED1 and ED2. The driving voltage supplying line 60 is arranged or disposed according to a first direction DR1, and may be connected to driving voltage lines (PL) arranged or disposed according to a second direction DR2.

The common voltage supplying line 70 may be disposed on the peripheral area PA. The common voltage supplying line 70 may surround the substrate 110. The common voltage supplying line 70 transmits the common voltage ELVSS to one electrode (for example, common electrode) of the light-emitting devices ED1 and ED2. A dam may be further positioned in the peripheral area PA, which will be described in a later part of the specification.

The light-emitting devices ED1 and ED2 may be positioned on at least some of (or a number of) the first pixel circuit unit PC1, the second pixel circuit unit PC2, and the driving circuit unit.

The first pixel circuit unit PC1 may be electrically connected to the first light-emitting device ED1 disposed on an upper side of the first pixel circuit unit PC1. The first pixel circuit unit PC1 and the first light-emitting device ED1 may be positioned in the first display area DA1. A region in which light emits by the first light-emitting device ED1 is the first display area DA1.

The second pixel circuit unit PC2 may be electrically connected to the second light-emitting device ED2. A region in which light emits by the second light-emitting device ED2 is the second display area DA2. A second light-emitting device ED2 electrically connected to the second pixel circuit unit PC2 and positioned on the second pixel circuit unit PC2 may be positioned in the second display area DA2. A second light-emitting device ED2 electrically connected to the second pixel circuit unit PC2 and positioned on the scan driver 20 may be positioned in the second display area DA2.

Regarding the general display device, the light-emitting devices ED1 and ED2 are positioned on the pixel circuit units PC1 and PC2, and no light-emitting device is positioned on the driving circuit unit. Regarding the display device according to an embodiment, the second light-emitting device ED2 may overlap the second pixel circuit unit PC2 and may also overlap the scan driver 20 of the driving circuit unit, thereby extending a screen displaying region. The second light-emitting device ED2 has been described in the above to overlap the scan driver 20, and without being limited thereto, the second light-emitting device ED2 may overlap other driving circuit units in addition to the scan driver 20.

A connection relationship between respective pixel circuit units of a display device and a light-emitting device according to an embodiment will now be described with reference to FIG. 3 to FIG. 5.

Figure 3:
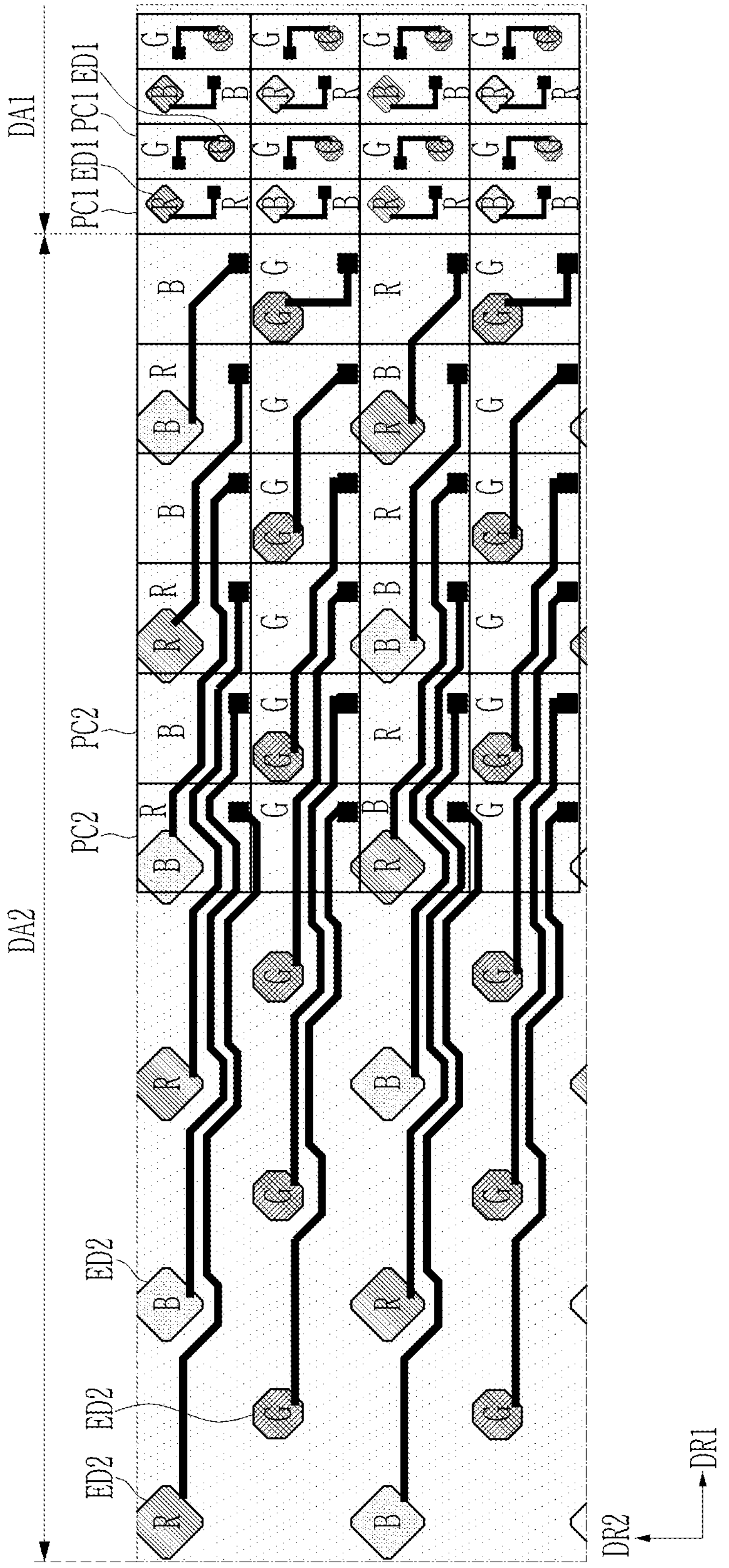
FIG. 3 shows a connection relationship of a pixel circuit unit and a light-emitting device of a display device according to an embodiment.
Figure 4:
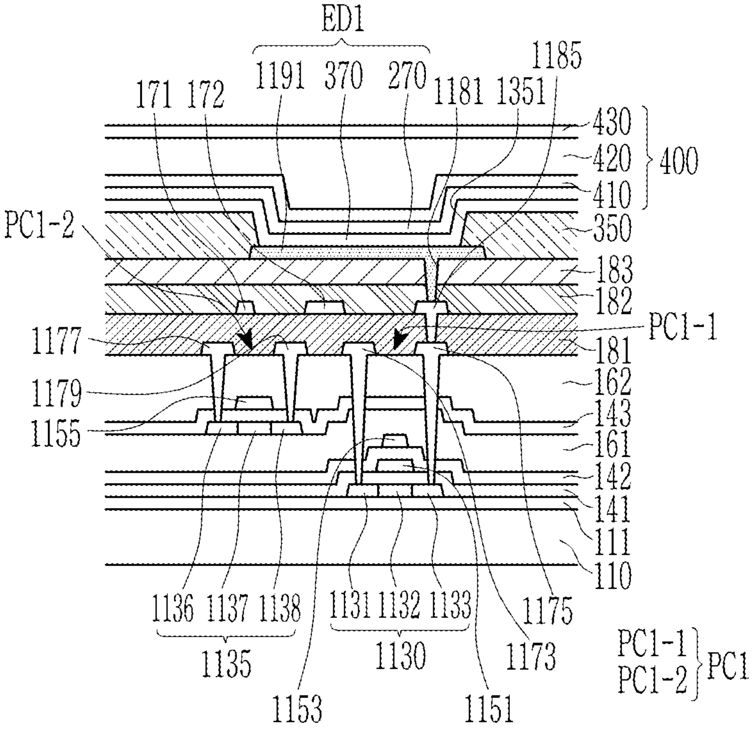
FIG. 4 shows a schematic cross-sectional view of a first pixel circuit unit and a first light-emitting device of a display device according to an embodiment.
Figure 5:
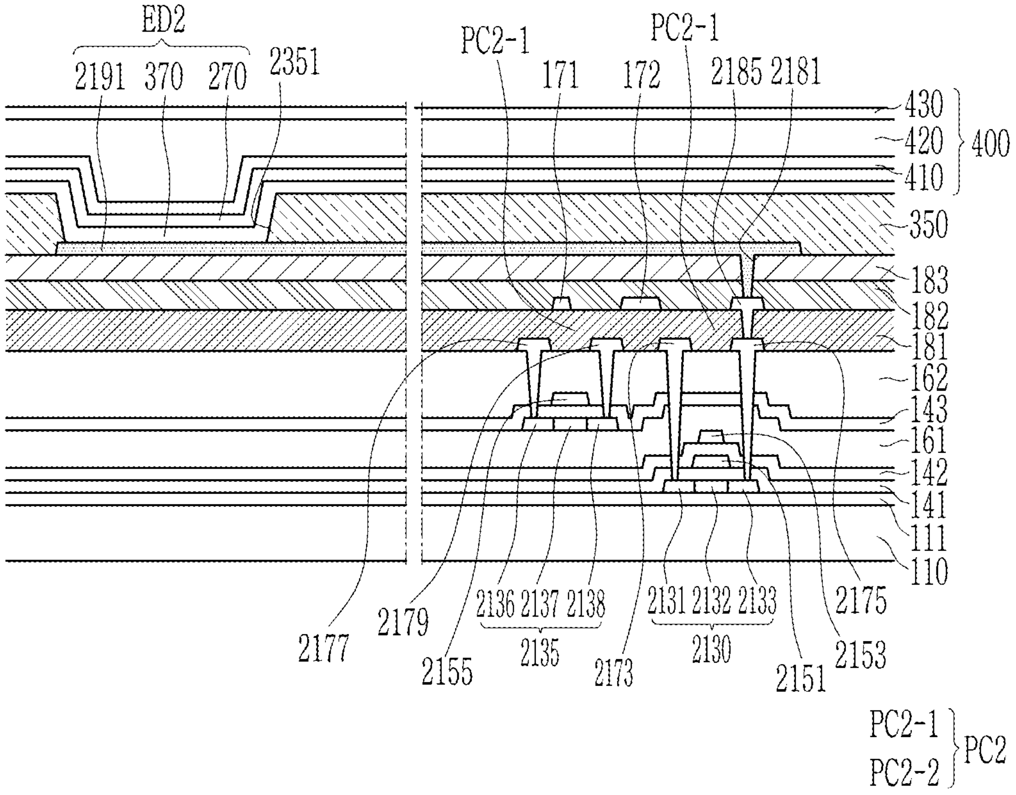
FIG. 5 shows a schematic cross-sectional view of a second pixel circuit unit and a second light-emitting device of a display device according to an embodiment.

FIG. 3 shows a connection relationship of a pixel circuit unit and a light-emitting device of a display device according to an embodiment, FIG. 4 shows a schematic cross-sectional view of a first pixel circuit unit and a first light-emitting device of a display device according to an embodiment, and FIG. 5 shows a schematic cross-sectional view of a second pixel circuit unit and a second light-emitting device of a display device according to an embodiment.

As shown in FIG. 3 and FIG. 4, the light emitting region of the first light-emitting device ED1 of the display device according to an embodiment overlaps the first pixel circuit unit PC1 connected to the first light-emitting device ED1. The first pixel circuit unit PC1 may include a first polycrystalline transistor PC1-1 and a first oxide transistor PC1-2.

The display device may include a substrate 110, a first polycrystalline transistor PC1-1 and a first oxide transistor PC1-2 positioned in the first display area DA1 of the substrate 110, and a first light-emitting device ED1 connected to the first polycrystalline transistor PC1-1.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may be a rigid substrate or a flexible substrate that is bent, folded, or rolled. The substrate 110 may be a single layer or a multilayer. The substrate 110 may be formed by alternately stacking at least one base layer with sequentially stacked polymer resins and at least one inorganic layer.

A buffer layer 111 may be positioned on the substrate 110. The buffer layer 111 may have a single- or multi-layered structure. The buffer layer 111 may include an inorganic insulating material such as a silicon nitride ($SiN_x$), a silicon oxide ($SiO_x$), or a silicon oxynitride ($SiO_xN_y$), or an organic insulating material. The buffer layer 111 may be omitted depending on cases. A barrier layer may be further positioned between the substrate 110 and the buffer layer 111. The barrier layer may have a single- or multi-layered structure. The barrier layer may include an inorganic insulating material such as a silicon nitride ($SiN_x$), a silicon oxide ($SiO_x$), or a silicon oxynitride ($SiO_xN_y$).

A polycrystalline semiconductor layer including a semiconductor 1130 of the first polycrystalline transistor PC1-1 of the first pixel circuit unit PC1 may be positioned on the buffer layer 111. The semiconductor 1130 of the first polycrystalline transistor PC1-1 may include a first region 1131, a channel 1132, and a second region 1133. The first region 1131 and the second region 1133 may be respectively positioned on the respective sides of the channel 1132 of the semiconductor 1130 of the first polycrystalline transistor PC1-1. The semiconductor 1130 of the first polycrystalline transistor PC1-1 may include a semiconductor material such as polysilicon.

A first gate insulating layer 141 may be positioned on the polycrystalline semiconductor layer including the semiconductor 1130 of the first polycrystalline transistor PC1-1 of the first pixel circuit unit PC1. The first gate insulating layer 141 may have a single- or multi-layered structure. The first gate insulating layer 141 may include an inorganic insulating material such as a silicon nitride ($SiN_x$), a silicon oxide ($SiO_x$), or a silicon oxynitride ($SiO_xN_y$).

A first gate conductive layer including a gate electrode 1151 of the first polycrystalline transistor PC1-1 may be positioned on the first gate insulating layer 141. The gate electrode 1151 of the first polycrystalline transistor PC1-1 may overlap the channel 1132 of the semiconductor 1130. The first gate conductive layer may have a single- or multi-layered structure. The first gate conductive layer may include a metal material such as molybdenum (Mo), aluminum (Al), copper (Cu), and/or titanium (Ti).

A doping process or a plasma process may be performed in case that the first gate conductive layer is formed. A portion of the polycrystalline semiconductor layer covered by the first gate conductive layer may not be doped or plasma processed, and a portion of the polycrystalline semiconductor layer not covered by the first gate conductive layer may be doped or plasma processed and may have the same characteristic as a conductor. A doping process of the polycrystalline semiconductor layer may be performed with a p-type dopant, and the first polycrystalline transistor PC1-1 including a polycrystalline semiconductor layer may have a p-type transistor characteristic.

A second gate insulating layer 142 may be positioned on the first gate conductive layer including the gate electrode 1151 of the first polycrystalline transistor PC1-1. The second gate insulating layer 142 may have a single- or multi-layered structure. The second gate insulating layer 142 may include an inorganic insulating material such as a silicon nitride ($SiN_x$), a silicon oxide ($SiO_x$), or a silicon oxynitride ($SiO_xN_y$).

A second gate conductive layer including a storage electrode 1153 may be positioned on the second gate insulating layer 142. The second gate conductive layer may have a single- or multi-layered structure. The second gate conductive layer may include a metal material such as molybdenum (Mo), aluminum (Al), copper (Cu), and/or titanium (Ti). The storage electrode 1153 may overlap the gate electrode 1151 of the first polycrystalline transistor PC1-1 and may form a storage capacitor. Although not shown, a light blocking layer may be further positioned on the second gate insulating layer 142, and the light blocking layer may overlap a semiconductor 1135 of the first oxide transistor PC1-2.

A first interlayer insulating layer 161 may be positioned on the second gate conductive layer including a storage electrode 1153. The first interlayer insulating layer 161 may have a single- or multi-layered structure. The first interlayer insulating layer 161 may include an inorganic insulating material such as a silicon nitride ($SiN_x$), a silicon oxide ($SiO_x$), or a silicon oxynitride ($SiO_xN_y$).

An oxide semiconductor layer including the semiconductor 1135 of the first oxide transistor PC1-2 of the first pixel circuit unit PC1 may be positioned on the first interlayer insulating layer 161. The semiconductor 1135 of the first oxide transistor PC1-2 may include a first region 1136, a channel 1137, and a second region 1138. A first region 1136 and a second region 1138 may be respectively positioned on respective sides of the channel 1137 of the semiconductor 1135 of the first oxide transistor PC1-2. The semiconductor 1135 of the first oxide transistor PC1-2 may include an oxide semiconductor material.

The oxide semiconductor layer may include at least one of unary metal oxides such as an indium (In)-based oxide, a tin (Sn)-based oxide, or a zinc (Zn)-based oxide; binary metal oxides such as an In—Zn-based oxide, an Sn—Zn-based oxide, an Al—Zn-based oxide, a Zn—Mg-based oxide, an —Sn—Mg based oxide, an In—Mg-based oxide, or an In—Ga-based oxide; ternary metal oxides such as an In—Ga—Zn-based oxide, an In—Al—Zn-based oxide, an In—Sn—Zn-based oxide, an Sn—Ga—Zn-based oxide, an Al—Ga—Zn-based oxide, an Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn based oxide, an In—Tb—Zn-based oxide, an In—Dy—Zn-based oxide, an In—Ho—Zn based-oxide, an In—Er—Zn-based oxide, an In—Tm—Zn-based oxide, an In—Yb—Zn-based oxide, or an In—Lu—Zn-based oxide; and quaternary metal oxides such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor layer may include the indium-gallium-zinc oxide (IGZO) from among the In—Ga—Zn-based oxides.

A third gate insulating layer 143 may be positioned on the oxide semiconductor layer including the semiconductor 1135 of the first oxide transistor PC1-2 of the first pixel circuit unit PC1. The third gate insulating layer 143 may be positioned on an entire side of the oxide semiconductor layer and the first interlayer insulating layer 161. Hence, the third gate insulating layer 143 may cover an upper side and a lateral side of the semiconductor 1135 of the first oxide transistor PC1-2. However, the embodiment is not limited thereto, and the third gate insulating layer 143 may not be positioned on the entire side of the oxide semiconductor layer and the first interlayer insulating layer 161. For example, the third gate insulating layer 143 may overlap the channel 1137 of the first oxide transistor PC1-2, and may not overlap the first region 1136 and the second region 1138. The third gate insulating layer 143 may include an inorganic insulating material such as a silicon nitride ($SiN_x$), a silicon oxide ($SiO_x$), or a silicon oxynitride ($SiO_xN_y$).

A third gate conductive layer including the gate electrode 1155 of the first oxide transistor PC1-2 may be positioned on the third gate insulating layer 143. The gate electrode 1155 of the first oxide transistor PC1-2 may overlap the channel 1137 of the semiconductor 1135. The third gate conductive layer may have a single- or multi-layered structure. The third gate conductive layer may include a metal material such as molybdenum (Mo), aluminum (Al), copper (Cu), and/or titanium (Ti).

A doping process or a plasma process may be performed in case that the third gate conductive layer is formed. A portion of the oxide semiconductor layer covered by the third gate conductive layer may not be doped or plasma processed, and a portion of the oxide semiconductor layer not covered by the third gate conductive layer may be doped or plasma processed and may have the same characteristic as a conductor. The doping process of an oxide semiconductor layer may be performed with an n-type dopant, and the first oxide transistor PC1-2 including an oxide semiconductor layer may have an n-type transistor characteristic.

A second interlayer insulating layer 162 may be positioned on the third gate conductive layer including the gate electrode 1155 of the first oxide transistor PC1-2. The second interlayer insulating layer 162 may have a single- or multi-layered structure. The second interlayer insulating layer 162 may include an inorganic insulating material such as a silicon nitride ($SiN_x$), a silicon oxide ($SiO_x$), or a silicon oxynitride ($SiO_xN_y$).

A first data conductive layer including a source electrode 1173 and a drain electrode 1175 of the first polycrystalline transistor PC1-1 and a source electrode 1177 and a drain electrode 1179 of the first oxide transistor PC1-2 may be positioned on the second interlayer insulating layer 162. The first data conductive layer may have a single- or multi-layered structure. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu). The first data conductive layer may have a triple-layered structure of a lower film containing a refractory metal such as molybdenum, chromium, tantalum, and titanium, or an alloy thereof; an intermediate film containing an aluminum-based metal, a silver-based metal, and a copper-based metal that have low resistivity; and an upper film containing a refractory metal such as molybdenum, chromium, tantalum, and titanium.

The second interlayer insulating layer 162, the third gate insulating layer 143, the first interlayer insulating layer 161, the second gate insulating layer 142, and the first gate insulating layer 141 may include an opening overlapping the source electrode 1173 of the first polycrystalline transistor PC1-1 and the first region 1131 of the semiconductor 1130. The source electrode 1173 of the first polycrystalline transistor PC1-1 may be connected to the first region 1131 of the semiconductor 1130 through an opening. The second interlayer insulating layer 162, the third gate insulating layer 143, the first interlayer insulating layer 161, the second gate insulating layer 142, and the first gate insulating layer 141 may include the opening overlapping the drain electrode 1175 of the first polycrystalline transistor PC1-1 and the second region 1133 of the semiconductor 1130. The drain electrode 1175 of the first polycrystalline transistor PC1-1 may be connected to the second region 1133 of the semiconductor 1130 through an opening. Accordingly, the above-described semiconductor 1130, the gate electrode 1151, the source electrode 1173, and the drain electrode 1175 may form the first polycrystalline transistor PC1-1. Depending on embodiments, the first polycrystalline transistor PC1-1 may not include the source electrode 1173 and the drain electrode 1175 but may include the first region 1131 and the second region 1133 of the semiconductor 1130.

The second interlayer insulating layer 162 and the third gate insulating layer 143 may include an opening overlapping the source electrode 1177 of the first oxide transistor PC1-2 and the first region 1136 of the semiconductor 1135. The source electrode 1177 of the first oxide transistor PC1-2 may be connected to the first region 1136 of the semiconductor 1135 through an opening. The second interlayer insulating layer 162 and the third gate insulating layer 143 may include an opening overlapping the drain electrode 1179 of the first oxide transistor PC1-2 and the second region 1138 of the semiconductor 1135. The drain electrode 1179 of the first oxide transistor PC1-2 may be connected to the second region 1138 of the semiconductor 1135 through an opening. Accordingly, the above-described semiconductor 1135, the gate electrode 1155, the source electrode 1177, and the drain electrode 1179 may form the first oxide transistor PC1-2. Depending on embodiments, the first oxide transistor PC1-2 may not include the source electrode 1177 and the drain electrode 1179 but may include the first region 1136 and the second region 1138 of the semiconductor 1135.

A first passivation layer 181 may be positioned on the first data conductive layer including the source electrode 1173 and the drain electrode 1175 of the first polycrystalline transistor PC1-1 and the source electrode 1177 and the drain electrode 1179 of the first oxide transistor PC1-2. The first passivation layer 181 may include an organic insulating material such as a general-purpose polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

A second data conductive layer including a connection electrode 1185, a data line 171, and a driving voltage line 172 may be positioned on the first passivation layer 181. The second data conductor may have a single- or multi-layered structure. The second data conductor may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first passivation layer 181 may include an opening overlapping the connection electrode 1185 and the drain electrode 1175 of the first polycrystalline transistor PC1-1. The connection electrode 1185 may be connected to the drain electrode 1175 of the first polycrystalline transistor PC1-1 through an opening.

A second passivation layer 182 may be positioned on the second data conductive layer including the connection electrode 1185, the data line 171, and the driving voltage line 172. A third passivation layer 183 may be positioned on the second passivation layer 182. The second passivation layer 182 and the third passivation layer 183 may include an organic insulating material such as a general-purpose polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer. An additional conductive layer may or may not be positioned between the second passivation layer 182 and the third passivation layer 183. Depending on cases, the third passivation layer 183 may be omitted.

A first light-emitting device ED1 connected to the first pixel circuit unit PC1 may be positioned on the third passivation layer 183. The first light-emitting device ED1 may be connected to the first polycrystalline transistor PC1-1 of the first pixel circuit unit PC1. The first light-emitting device ED1 may include a first pixel electrode 1191, an emission layer 370, and a common electrode 270.

The first pixel electrode 1191 of the first light-emitting device ED1 may be positioned on the third passivation layer 183. The third passivation layer 183 and the second passivation layer 182 may include an opening 1181 overlapping the first pixel electrode 1191 and the connection electrode 1185. The first pixel electrode 1191 of the first light-emitting device ED1 may be connected to the connection electrode 1185 through an opening 1181. Hence, the first pixel electrode 1191 of the first light-emitting device ED1 may be connected to the drain electrode 1175 of the first polycrystalline transistor PC1-1 of the first pixel circuit unit PC1 through the connection electrode 1185.

A bank layer 350 may be positioned on the first pixel electrode 1191 of the first light-emitting device ED1. The bank layer 350 is also referred to as a pixel defining layer (PDL), and may include a pixel opening 1351 overlapping at least part of the first pixel electrode 1191. The pixel opening 1351 may overlap the center portion of the first pixel electrode 1191 and may not overlap an edge of the first pixel electrode 1191. Therefore, the pixel opening 1351 may be smaller than the first pixel electrode 1191. The bank layer 350 may be an organic insulator including at least one material of a polyimide, a polyamide, an acryl resin, a benzocyclobutene, and a phenol resin. Depending on embodiments, the bank layer 350 may be made of a black pixel defining layer (BPDL) including a black color pigment.

The pixel opening 1351 may partition a formation position of the emission layer 370 so that the emission layer 370 may be positioned on a portion where the upper side of the first pixel electrode 1191 is exposed. The emission layer 370 may include layers, some of (or a number of) the layers may be made in the pixel opening 1351, and the rest thereof may be made on the bank layer 350 as well as in the pixel opening 1351. For example, some of (or a number of) the emission layer 370 may be generally positioned in most of the region on the substrate 110.

The common electrode 270 may be positioned on the emission layer 370. The common electrode 270 may be generally positioned in most of the region on the substrate 110. The common electrode 270 may also be referred to as a cathode, and may be made of a transparent conductive layer including an indium tin oxide (ITO), an indium zinc oxide (IZO), an indium gallium zinc oxide (IGZO), and an indium tin zinc oxide (ITZO). The common electrode 270 may have a semi-transparent characteristic, and it may form a microcavity with the first pixel electrode 1191. According to the microcavity structure, light with a given or selected wavelength is discharged upward by a gap between two electrodes and the characteristic, thereby displaying the red, the green, or the blue.

The first light-emitting device ED1 emits light with respect to the region in which the first pixel electrode 1191, the emission layer 370, and the common electrode 270 overlap each other, and the light emitting region of the first light-emitting device ED1 may overlap the first pixel circuit unit PC1 connected to the light emitting region thereof.

In the first display area DA1, the first pixel circuit unit PC1 and the first light-emitting device ED1 may be disposed in a matrix form in the first direction DR1 and a second direction DR2. The first pixel circuit unit PC1 positioned in the first row and the first column is connected to the first light-emitting device ED1 positioned in the first row and the first column and overlaps the same. The first pixel circuit unit PC1 positioned in the first row and the second column is connected to the first light-emitting device ED1 positioned in the first row and the second column and overlaps the same. The first pixel circuit unit PC1 positioned in the second row and the first column is connected to the first light-emitting device ED1 positioned in the second row and the first column and overlaps the same. The first pixel circuit unit PC1 positioned in the second row and the second column is connected to the first light-emitting device ED1 positioned in the second row and the second column and overlaps the same.

The respective first light-emitting devices ED1 may display at least one of a first color, a second color, and a third color. For example, the first light-emitting device ED1 may display red (R), green (G), and blue (B).

An encapsulation layer 400 may be positioned on the common electrode 270. The encapsulation layer 400 may include at least one inorganic film and at least one organic film. The encapsulation layer 400 may include a first inorganic encapsulation layer 410, an organic encapsulation layer 420, and a second inorganic encapsulation layer 430. However, this is an example, and numbers of the inorganic films and the organic films forming the encapsulation layer 400 are modifiable in many ways. The encapsulation layer 400 protects the light-emitting devices ED1 and ED2 from moisture or oxygen that may be input from the outside, and one end portions of the first inorganic encapsulation layer 410 and the second inorganic encapsulation layer 430 may contact or directly contact each other.

As shown in FIG. 3 and FIG. 5, the light emitting region of the second light-emitting device ED2 of the display device according to an embodiment may not overlap the second pixel circuit unit PC2 connected to the second light-emitting device ED2. The second pixel circuit unit PC2 may include a second polycrystalline transistor PC2-1 and a second oxide transistor PC2-2.

The display device may include a substrate 110, a second polycrystalline transistor PC2-1 and a second oxide transistor PC2-2 positioned in the second display area DA2 of the substrate 110, and a second light-emitting device ED2 connected to the second polycrystalline transistor PC2-1.

A buffer layer 111 may be positioned on the substrate 110, and the semiconductor 2130 of the second polycrystalline transistor PC2-1 of the second pixel circuit unit PC2 may be positioned on the buffer layer 111. The semiconductor 2130 of the second pixel circuit unit PC2 may be positioned on the polycrystalline semiconductor layer. The semiconductor 2130 of the second polycrystalline transistor PC2-1 may include a first region 2131, a channel 2132, and a second region 2133. A first region 2131 and a second region 2133 may be positioned on respective sides of the channel 2132 of the semiconductor 2130 of the second polycrystalline transistor PC2-1.

The first gate insulating layer 141 may be positioned on the semiconductor 2130 of the second polycrystalline transistor PC2-1 of the second pixel circuit unit PC2, and the gate electrode 2151 of the second polycrystalline transistor PC2-1 may be positioned on the first gate insulating layer 141. The gate electrode 2151 of the second polycrystalline transistor PC2-1 may be positioned on the first gate conductive layer. The gate electrode 2151 of the second polycrystalline transistor PC2-1 may overlap the channel 2132 of the semiconductor 2130.

A doping process or a plasma process may be performed in case that the first gate conductive layer is formed. The doping process of the polycrystalline semiconductor layer may be performed with the p-type dopant, and the second polycrystalline transistor PC2-1 including a polycrystalline semiconductor layer may have a p-type transistor characteristic.

The second gate insulating layer 142 may be positioned on the gate electrode 2151 of the second polycrystalline transistor PC2-1, and the storage electrode 2153 may be positioned on the second gate insulating layer 142. The storage electrode 2153 may be positioned on the second gate conductive layer. The storage electrode 2153 may overlap the gate electrode 2151 of the second polycrystalline transistor PC2-1 to form a storage capacitor. Although not shown, a light blocking layer may be further positioned on the second gate insulating layer 142, and the light blocking layer may overlap the semiconductor 2135 of the second oxide transistor PC2-2 to be described.

The first interlayer insulating layer 161 may be positioned on the storage electrode 2153, and the semiconductor 2135 of the second oxide transistor PC2-2 of the second pixel circuit unit PC2 may be positioned on the first interlayer insulating layer 161. The semiconductor 2135 of the second oxide transistor PC2-2 may be positioned on the oxide semiconductor layer. The semiconductor 2135 of the second oxide transistor PC2-2 may include a first region 2136, a channel 2137, and a second region 2138.

The third gate insulating layer 143 may be positioned on the semiconductor 2135 of the second oxide transistor PC2-2, and the gate electrode 2155 of the second oxide transistor PC2-2 may be positioned on the third gate insulating layer 143. The gate electrode 2155 of the second oxide transistor PC2-2 may overlap the channel 2137 of the semiconductor 2135.

The doping process or the plasma process may be performed in case that the third gate conductive layer is formed. The doping process of the oxide semiconductor layer may be performed with the n-type dopant, and the second oxide transistor PC2-2 including an oxide semiconductor layer may have an n-type transistor characteristic.

The second interlayer insulating layer 162 may be positioned on the gate electrode 2155 of the second oxide transistor PC2-2. A source electrode 2173 and a drain electrode 2175 of the second polycrystalline transistor PC2-1 and a source electrode 2177 and a drain electrode 2179 of the second oxide transistor PC2-2 may be positioned on the second interlayer insulating layer 162. A source electrode 2173 and a drain electrode 2175 of the second polycrystalline transistor PC2-1 and a source electrode 2177 and a drain electrode 2179 of the second oxide transistor PC2-2 may be positioned on the first data conductive layer.

The source electrode 2173 of the second polycrystalline transistor PC2-1 may be connected to the first region 2131 of the semiconductor 2130. The drain electrode 2175 of the second polycrystalline transistor PC2-1 may be connected to the second region 2133 of the semiconductor 2130. Accordingly, the above-described semiconductor 2130, the gate electrode 2151, the source electrode 2173, and the drain electrode 2175 may form the second polycrystalline transistor PC2-1. Depending on embodiments, the second polycrystalline transistor PC2-1 may not include the source electrode 2173 and the drain electrode 2175 but may include the first region 2131 and the second region 2133 of the semiconductor 2130.

The source electrode 2177 of the second oxide transistor PC2-2 may be connected to the first region 2136 of the semiconductor 2135. The drain electrode 2179 of the second oxide transistor PC2-2 may be connected to the second region 2138 of the semiconductor 2135. Accordingly, the above-described semiconductor 2135, the gate electrode 2155, the source electrode 2177, and the drain electrode 2179 may form the second oxide transistor PC2-2. Depending on embodiments, the second oxide transistor PC2-2 may not include the source electrode 2177 and the drain electrode 2179 but may include the first region 2136 and the second region 2138 of the semiconductor 2135.

The first passivation layer 181 may be positioned on the source electrode 2173 and the drain electrode 2175 of the second polycrystalline transistor PC2-1 and the source electrode 2177 and the drain electrode 2179 of the second oxide transistor PC2-2. A connection electrode 2185, a data line 171, and a driving voltage line 172 may be positioned on the first passivation layer 181. The connection electrode 2185 may be connected to the drain electrode 2175 of the second polycrystalline transistor PC2-1.

A second passivation layer 182 and a third passivation layer 183 may be positioned on the connection electrode 2185, the data line 171, and the driving voltage line 172. A second light-emitting device ED2 connected to the first pixel circuit unit PC1 may be positioned on the third passivation layer 183. The second light-emitting device ED2 may be connected to the second polycrystalline transistor PC2-1 of the second pixel circuit unit PC2. The second light-emitting device ED2 may include a second pixel electrode 2191, an emission layer 370, and a common electrode 270.

A second light-emitting device ED2 connected to the second pixel circuit unit PC2 may be positioned on the third passivation layer 183. The second light-emitting device ED2 may be connected to the second polycrystalline transistor PC2-1 of the second pixel circuit unit PC2. The second light-emitting device ED2 may include a second pixel electrode 2191, an emission layer 370, and a common electrode 270.

The second pixel electrode 2191 of the second light-emitting device ED2 may be positioned on the third passivation layer 183. The third passivation layer 183 and the second passivation layer 182 may include an opening 2181 overlapping the second pixel electrode 2191 and the connection electrode 2185. The second pixel electrode 2191 of the second light-emitting device ED2 may be connected to the connection electrode 2185 through the opening 2181. Therefore, the second pixel electrode 2191 of the second light-emitting device ED2 may be connected to the drain electrode 2175 of the second polycrystalline transistor PC2-1 of the second pixel circuit unit PC2 through the connection electrode 2185.

A bank layer 350 may be positioned on the second pixel electrode 2191 of the second light-emitting device ED2. The bank layer 350 may include a pixel opening 2351 overlapping at least part of the second pixel electrode 2191. The pixel opening 2351 may overlap a center portion of the second pixel electrode 2191 and may not overlap an edge of the second pixel electrode 2191. Therefore, the pixel opening 2351 may be smaller than the second pixel electrode 2191.

The pixel opening 2351 may partition the formation position of the emission layer 370 so that the emission layer 370 may be positioned on the portion where the upper side of the second pixel electrode 2191 is exposed. The emission layer 370 may include layers, some of (or a number of) the layers may be made in the pixel opening 2351, and the rest thereof may be made on the bank layer 350 as well as in the pixel opening 2351.

The second light-emitting device ED2 emits light with respect to the region in which the second pixel electrode 2191, the emission layer 370, and the common electrode 270 overlap each other, and the light emitting region of the second light-emitting device ED2 may not overlap the second pixel circuit unit PC2 connected to the light emitting region thereof.

The second pixel circuit unit PC2 and the second light-emitting device ED2 are disposed in a matrix form in the first direction DR1 and the second direction DR2 in the second display area DA2. The second pixel circuit unit PC2 positioned in the first row and the first column is connected to the second light-emitting device ED2 positioned in the first row and the first column and substantially does not overlap the same. Hence, the light emitting region of the second light-emitting device ED2 may not overlap the second pixel circuit unit PC2 connected to the light emitting region thereof. The second pixel electrode 2191 may substantially extend in the first direction DR1 so as to connect the second pixel circuit unit PC2 and the second light-emitting device ED2. However, without being limited thereto, the display device may further include an additional connection electrode for connecting the second pixel circuit unit PC2 and the second light-emitting device ED2.

The second pixel circuit unit PC2 positioned in the first row and the second column is connected to the second light-emitting device ED2 positioned in the first row and the second column, and the light emitting region of the second light-emitting device ED2 does not overlap the second pixel circuit unit PC2 connected to the light emitting region thereof. The second pixel circuit unit PC2 positioned in the second row and the first column is connected to the second light-emitting device ED2 positioned in the second row and the first column, and the light emitting region of the second light-emitting device ED2 does not overlap the second pixel circuit unit PC2 connected to the light emitting region thereof. The second pixel circuit unit PC2 positioned in the second row and the second column is connected to the second light-emitting device ED2 positioned in the second row and the second column, and the light emitting region of the second light-emitting device ED2 does not overlap the second pixel circuit unit PC2 connected to the light emitting region thereof.

The light emitting region of some second light-emitting device ED2 may overlap the second pixel circuit unit PC2 not connected to the light emitting region thereof. For example, the light emitting region of the second light-emitting device ED2 positioned in the first row and the fourth column may overlap the second pixel circuit unit PC2 positioned in the first row and the first column. The light emitting region of the second light-emitting device ED2 positioned in the first row and the fifth column may overlap the second pixel circuit unit PC2 positioned in the first row and the third column. The light emitting region of the second light-emitting device ED2 positioned in the first row and the sixth column may overlap the second pixel circuit unit PC2 positioned in the first row and the fifth column.

The light emitting region of some second light-emitting device ED2 may overlap the second pixel circuit unit PC2 connected to the light emitting region thereof. For example, the light emitting region of the second light-emitting device ED2 positioned in the second row and the sixth column may overlap the second pixel circuit unit PC2 positioned in the second row and the sixth column.

The respective second light-emitting devices ED2 may display at least one of a first color, a second color, and a third color. For example, the second light-emitting device ED2 may display red (R), green (G), and blue (B).

Regarding the display device according to an embodiment, the second light-emitting device ED2 is positioned in the region in which the second pixel circuit unit PC2 is disposed and in the region in which the driving circuit unit is disposed, thereby extending the region in which the screen is displayed. A pixel density in the second display area DA2 may be relatively low compared to a pixel density in the first display area DA1. To compensate the lowered pixel density, the second light-emitting device ED2 is made big to thus increase luminance of the second light-emitting device ED2. Accordingly, to supply more current to the second light-emitting device ED2, the respective elements included in the second pixel circuit unit PC2 may be made big. For example, the area of the second pixel circuit unit PC2 may be increased. For example, the area of the second pixel circuit unit PC2 may be about twice the area of the first pixel circuit unit PC1. The area of the second light-emitting device ED2 may be about twice the area of the first light-emitting device ED1. However, this is an example, and the areas of the second pixel circuit unit PC2 and the second light-emitting device ED2 may be set in many ways.

FIG. 4 shows a connection relationship between some of (or a number of) transistors and the first light-emitting device ED1 included in the first pixel circuit unit PC1, and without being limited thereto, the first pixel circuit unit PC1 may include a lot more transistors. Similarly, FIG. 5 shows a connection relationship between some of (or a number of) transistors and the second light-emitting device ED2 included in the second pixel circuit unit PC2, and without being limited thereto, the second pixel circuit unit PC2 may include a lot more transistors. An example of transistors included in the respective first pixel circuit unit PC1 and the second pixel circuit unit PC2 will now be described with reference to FIG. 6.

Figure 6:
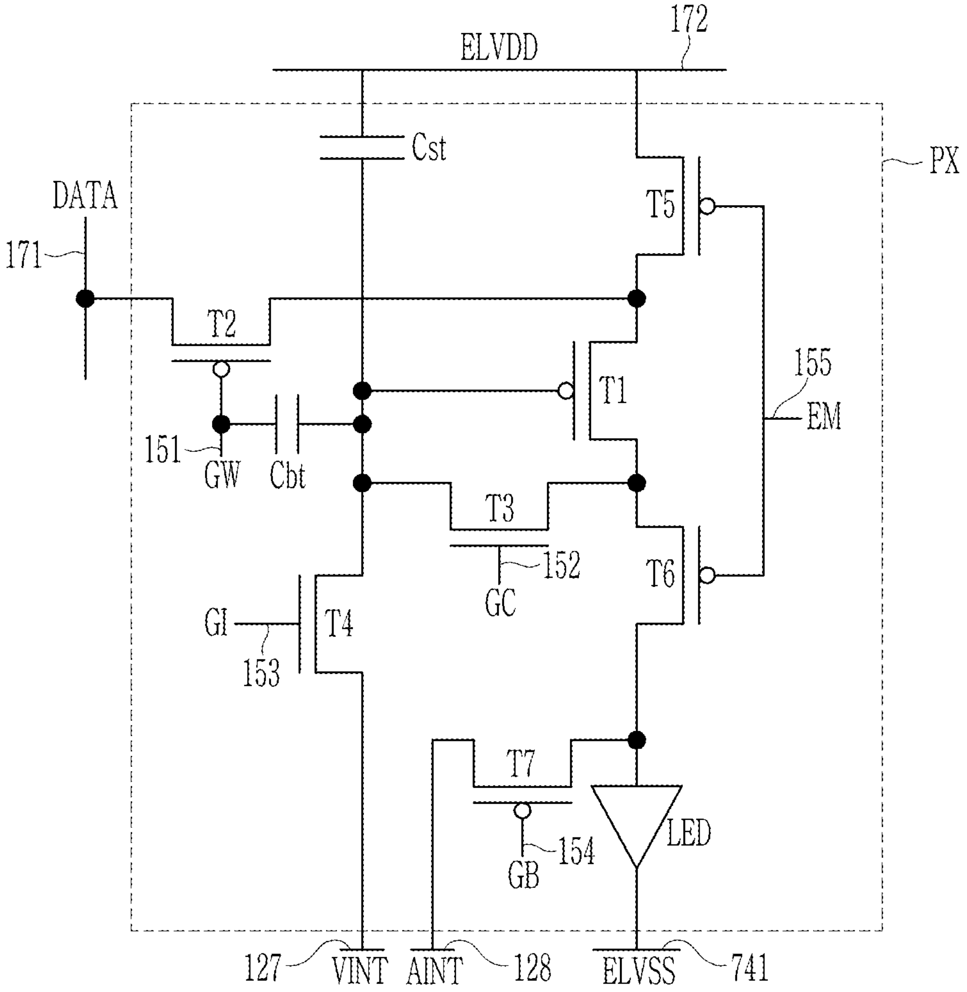
FIG. 6 shows a schematic diagram of an equivalent circuit of a display device according to an embodiment.

FIG. 6 shows a schematic diagram of an equivalent circuit of a display device according to an embodiment.

As shown in FIG. 6, one pixel PX of the display device according to an embodiment may include transistors T1, T2, T3, T4, T5, T6, and T7, a storage capacitor Cst, a boost capacitor Cbt, and a light emitting diode LED connected to wires 127, 128, 151, 152, 153, 154, 155, 171, 172, and 741.

The wires 127, 128, 151, 152, 153, 154, 155, 171, 172, and 741 are connected to the pixel PX. The wires include a first initialization voltage line 127, a second initialization voltage line 128, a first scan signal line 151, a second scan signal line 152, an initialization control line 153, a bypass control line 154, a light-emitting control line 155, a data line 171, a driving voltage line 172, and a common voltage line 741.

The first scan signal line 151 transmits a first scan signal GW to the second transistor T2. The second scan signal line 152 may receive a voltage with an opposite polarity to the voltage applied to the first scan signal line 151 at a same timing as the signal of the first scan signal line 151. For example, in case that a voltage with a negative polarity is applied to the first scan signal line 151, a voltage with a positive polarity may be applied to the second scan signal line 152. The second scan signal line 152 transmits a second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may be formed with the first scan signal line 151 at a previous stage. The light-emitting control line 155 transmits a light emitting control signal EM to the fifth transistor T5 and the sixth transistor T6.

The first scan signal line 151, the second scan signal line 152, the initialization control line 153, and the light-emitting control line 155 receive scan signals generated by the scan driver 20 and transmit them to the pixels. The scan driver 20 of the driving circuit unit may include drivers. The drivers may include a driver for generating a first scan signal GW, a driver for generating a second scan signal GC, a driver for generating an initialization control signal GI, and a driver for generating a light emitting control signal EM.

The data line 171 transmits a data voltage DATA generated by the data driver 50, and luminance of light emitted by the light emitting diode LED is changed according to the data voltage DATA applied to the pixel PX.

The driving voltage line 172 applies a driving voltage ELVDD. The first initialization voltage line 127 transmits a first initialization voltage VINT, and the second initialization voltage line 128 transmits a second initialization voltage AINT. The common voltage line 741 applies a common voltage ELVSS to a cathode of the light emitting diode LED. Voltages may be applied to the driving voltage line 172, the first and second initialization voltage lines 127 and 128, and the common voltage line 741.

A structure and a connection relationship of transistors will now be described in detail.

The driving transistor T1 may have the p-type transistor characteristic, and may include a polycrystalline semiconductor. The driving transistor T1 controls the current output to an anode of the light emitting diode LED according to the data voltage DATA applied to the gate electrode of the driving transistor T1. Brightness of the light emitting diode LED is controlled according to the size of the driving current output to the anode of the light emitting diode LED so luminance of the light emitting diode LED may be controlled according to the data voltage DATA applied to the pixel PX. For this purpose, the first electrode of the driving transistor T1 is disposed to receive the driving voltage ELVDD, and is connected to the driving voltage line 172 through the fifth transistor T5. The first electrode of the driving transistor T1 is connected to the second electrode of the second transistor T2 to receive the data voltage DATA. The second electrode of the driving transistor T1 is disposed to output a current to the light emitting diode LED, and is connected to the anode of the light emitting diode LED through the sixth transistor T6. The second electrode of the driving transistor T1 transmits the data voltage DATA applied to the first electrode to the third transistor T3. The gate electrode of the driving transistor T1 is connected to one electrode (also referred to as a second storage electrode) of the storage capacitor Cst. The voltage at the gate electrode of the driving transistor T1 is changed according to the voltage stored in the storage capacitor Cst, and the driving current output by the driving transistor T1 is changed. The storage capacitor Cst maintains the voltage at the gate electrode of the driving transistor T1 for one frame.

The second transistor T2 may have a p-type transistor characteristic, and may include a polycrystalline semiconductor. The second transistor T2 allows the data voltage DATA to be received into the pixel PX. The gate electrode of the second transistor T2 is connected to the first scan signal line 151 and one electrode (also referred to as a lower boost electrode) of the boost capacitor Cbt. The first electrode of the second transistor T2 is connected to the data line 171. The second electrode of the second transistor T2 is connected to the first electrode of the driving transistor T1. In case that the second transistor T2 is turned on by the voltage with a negative polarity from among the first scan signal GW transmitted through the first scan signal line 151, the data voltage DATA transmitted through the data line 171 is transmitted to the first electrode of the driving transistor T1.

The third transistor T3 may have an n-type transistor characteristic, and may include an oxide semiconductor. The third transistor T3 electrically connects the second electrode of the driving transistor T1 and the gate electrode of the driving transistor T1. As a result, the third transistor T3 transmits a compensated voltage that is generated in case that the data voltage DATA passes through the driving transistor T1 to the second storage electrode of the storage capacitor Cst. The gate electrode of the third transistor T3 is connected to the second scan signal line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and another electrode (also referred to as an upper boost electrode) of the boost capacitor Cbt. The third transistor T3 is turned on by the voltage with a positive polarity from among the second scan signal GC transmitted through the second scan signal line 152 to connect the gate electrode of the driving transistor T1 and the second electrode of the driving transistor T1, and the voltage applied to the gate electrode of the driving transistor T1 is transmitted to the second storage electrode of the storage capacitor Cst and is stored in the storage capacitor Cst.

The fourth transistor T4 may have an n-type transistor characteristic, and may include an oxide semiconductor. The fourth transistor T4 initializes the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 passes through the second electrode of the third transistor T3 and is connected to the second storage electrode of the storage capacitor Cst, the gate electrode of the driving transistor T1, and an upper boost electrode. The fourth transistor T4 is turned on by the voltage with a positive polarity from among the initialization control signal GI transmitted through the initialization control line 153, and in this instance, transmits the first initialization voltage VINT to the gate electrode of the driving transistor T1 and the second storage electrode of the storage capacitor Cst. Accordingly, the voltage at the gate electrode of the driving transistor T1 and the storage capacitor Cst are initialized.

The fifth transistor T5 may have a p-type transistor characteristic, and may include a polycrystalline semiconductor. The fifth transistor T5 transmits the driving voltage ELVDD to the driving transistor T1. A gate electrode of the fifth transistor T5 is connected to the light-emitting control line 155, a first electrode of the fifth transistor T5 is connected to the driving voltage line 172, and a second electrode of the fifth transistor T5 is connected to the first electrode of the driving transistor T1.

The sixth transistor T6 may have a p-type transistor characteristic, and may include a polycrystalline semiconductor. The sixth transistor T6 transmits a driving current output by the driving transistor T1 to the light emitting diode LED. A gate electrode of the sixth transistor T6 is connected to the light-emitting control line 155, a first electrode of the sixth transistor T6 is connected to the second electrode of the driving transistor T1, and a second electrode of the sixth transistor T6 is connected to the anode of the light emitting diode LED.

The seventh transistor T7 may have a p-type transistor characteristic, and may include a polycrystalline semiconductor. The seventh transistor T7 initializes the anode of the light emitting diode LED. A gate electrode of the seventh transistor T7 is connected to the bypass control line 154, a first electrode of the seventh transistor T7 is connected to the anode of the light emitting diode LED, and a second electrode of the seventh transistor T7 is connected to the second initialization voltage line 128. In case that the seventh transistor T7 is turned on by the voltage with a negative polarity from among the bypass signal GB, the second initialization voltage AINT is applied to the anode of the light emitting diode LED to be initialized.

One pixel PX has been described in the above to include seven transistors T1 to T7, one storage capacitor Cst, and one boost capacitor Cbt, and without being limited thereto, the number of transistors, the number of capacitors, and their connection relationships are modifiable in many ways.

The driving transistor T1 may include a polycrystalline semiconductor. The third transistor T3 and the fourth transistor T4 may include oxide semiconductors. The second transistor T2, the fifth transistor T5, the sixth transistor T6, and the seventh transistor T7 may include polycrystalline semiconductors. However, without being limited thereto, at least one of the second transistor T2, the fifth transistor T5, the sixth transistor T6, and the seventh transistor T7 may include an oxide semiconductor. The entire transistors may include polycrystalline semiconductors. The third transistor T3 and the fourth transistor T4 include semiconductor materials that are different from that of the driving transistor T1 so they may be driven more stably and reliability may be increased.

The driving transistor T1, the second transistor T2, the fifth transistor T5, the sixth transistor T6, and the seventh transistor T7 have been described to have a p-type transistor characteristic, and the third transistor T3 and the fourth transistor T4 have been described to have an n-type transistor characteristic, but are not limited thereto. The characteristics of the respective transistors may be changed to have opposite ones, and all the transistors may have the same characteristic.

In case that all the transistors have the same semiconductor and the same characteristic, the number of conductive layers and insulating layers may be reduced.

The peripheral area of the display device according to an embodiment will now be described with reference to FIG. 7 to FIG. 11.

Figure 7:
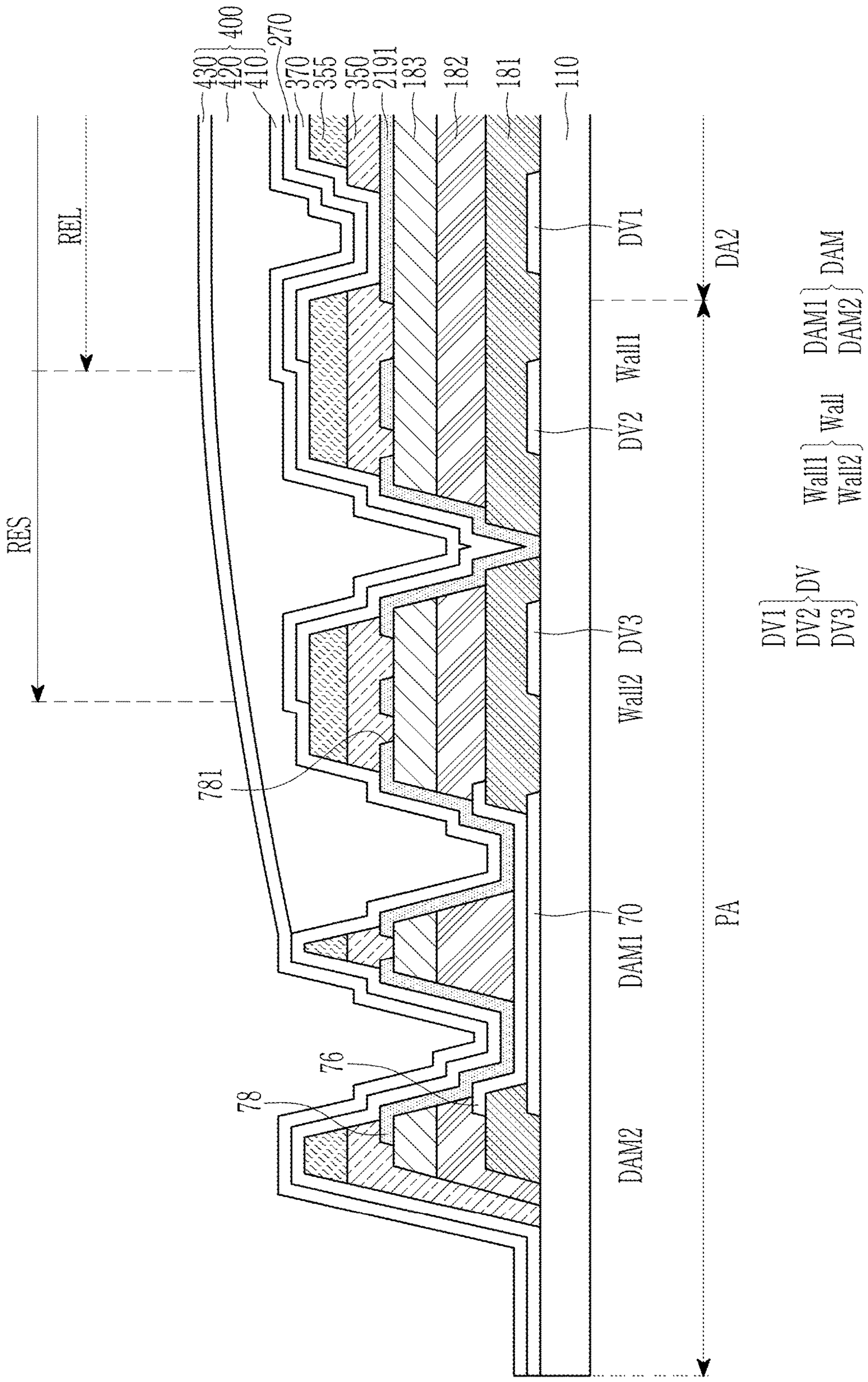
FIG. 7 shows a schematic cross-sectional view of a second display area and a peripheral area of a display device according to an embodiment.
Figure 8:
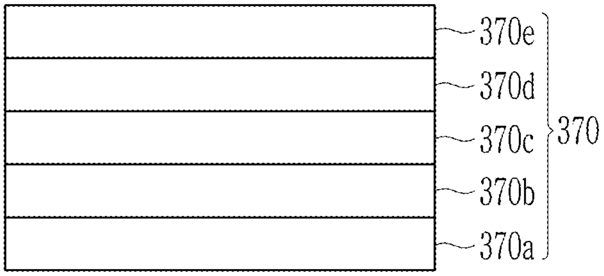
FIG. 8 shows a detailed schematic cross-sectional view of layers of a display device according to an embodiment.
Figure 9:
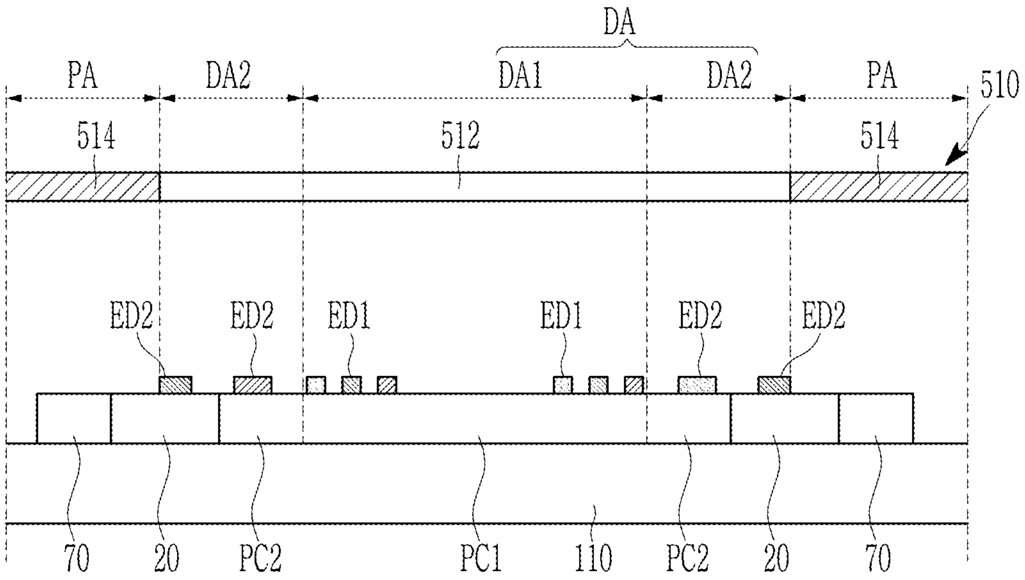
FIG. 9 and FIG. 10 show a state in which a mask is corresponded to form layers of a display device according to an embodiment.
Figure 10:
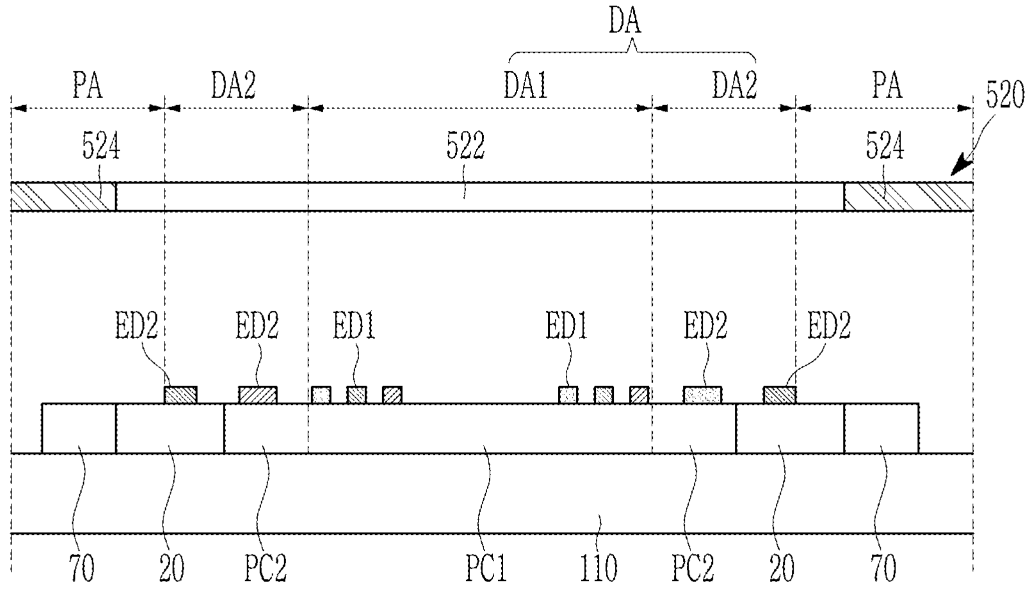
Figure 11:
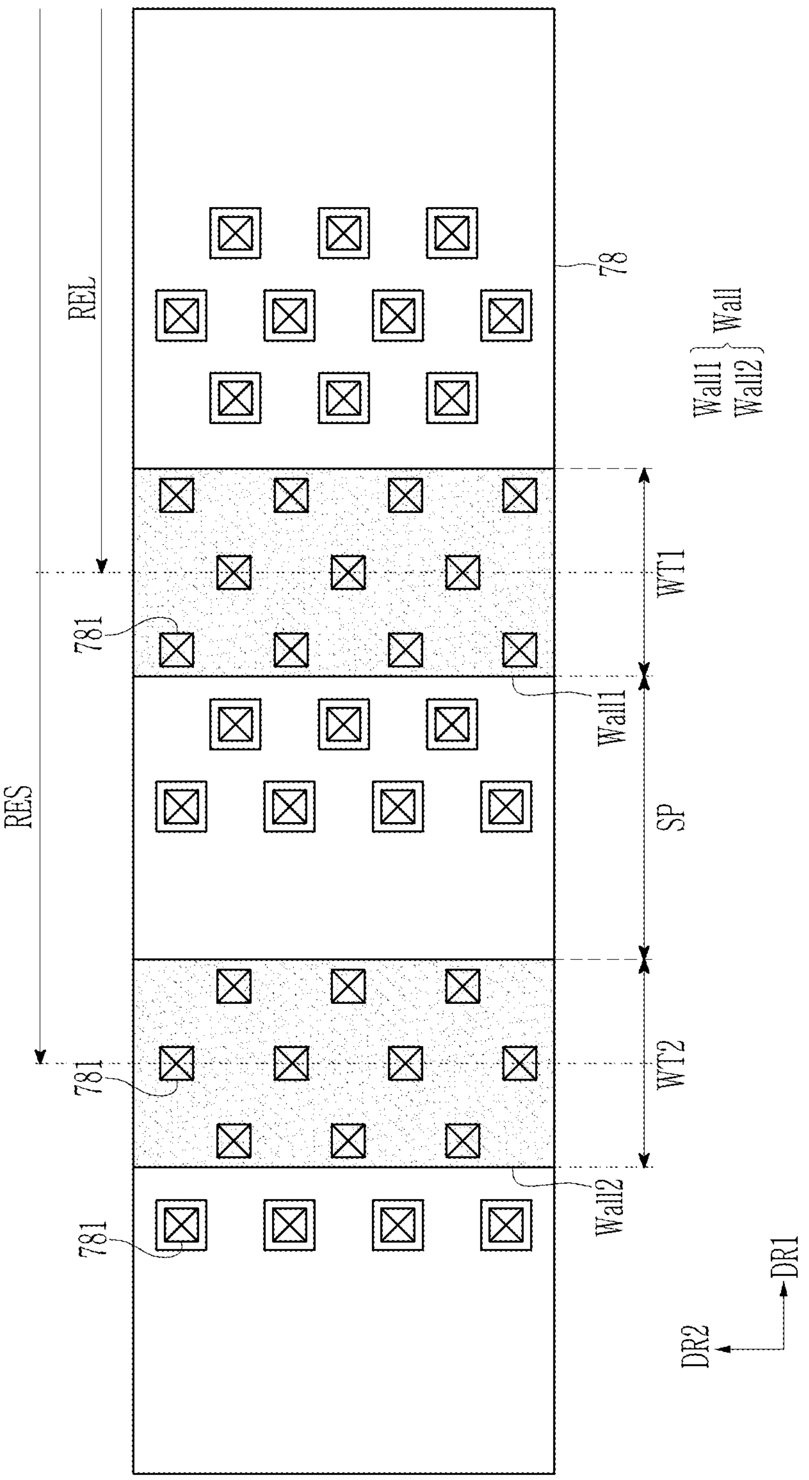
FIG. 11 shows a schematic top plan view of layers of a display device according to an embodiment.

FIG. 7 shows a schematic cross-sectional view of a second display area and a peripheral area of a display device according to an embodiment, and FIG. 8 shows a detailed schematic cross-sectional view of layers of a display device according to an embodiment. FIG. 9 and FIG. 10 show a state in which a mask is corresponded to form layers of a display device according to an embodiment. FIG. 9 shows a mask for forming an emission layer, and FIG. 10 shows a mask for forming a common electrode. FIG. 11 shows a schematic top plan view of layers of a display device according to an embodiment.

As shown in FIG. 7, the display device may include a substrate 110, and a driving circuit unit DV and a common voltage supplying line 70 positioned on the substrate 110. FIG. 7 omits illustration of some (or a number of) layers positioned on the substrate 110. For example, the buffer layer, the polycrystalline semiconductor layer, the first gate insulating layer, the first gate conductive layer, the second gate insulating layer, the second gate conductive layer, the first interlayer insulating layer, the oxide semiconductor layer, the third gate insulating layer, the third gate conductive layer, and the second interlayer insulating layer are omitted in FIG. 7. The driving circuit unit DV and the common voltage supplying line 70 may include at least one of the polycrystalline semiconductor layer, the first gate conductive layer, the second gate conductive layer, the oxide semiconductor layer, the third gate conductive layer, and the first data conductive layer. For example, the common voltage supplying line 70 may be positioned on the first data conductive layer.

The driving circuit unit DV may include drivers DV1, DV2, and DV3. The drivers DV1, DV2, and DV3 may include a first driver DV1, a second driver DV2, and a third driver DV3. This is, however, an example, and the number of the drivers DV1, DV2, and DV3 is variable in many ways. For example, the first driver DV1 may generate a first scan signal, the second driver DV2 may generate a second scan signal, and the third driver DV3 may generate an initialization control signal. Although not shown, a driver for generating a light emitting control signal may be further included. Part of the driving circuit unit DV may be positioned in the second display area DA2, and the other thereof may be positioned in the peripheral area PA. For example, the first driver DV1 may be positioned in the second display area DA2 and may overlap the second light-emitting device ED2. The second driver DV2 and the third driver DV3 may be positioned in the peripheral area PA.

The common voltage supplying line 70 may transmit the common voltage ELVSS. The common voltage supplying line 70 may be positioned on a same layer as some (or a number of) layers of the driving circuit unit DV. The common voltage supplying line 70 may be positioned in the peripheral area PA. The common voltage supplying line 70 may be positioned nearer the edge of the substrate 110 than the driving circuit unit DV. For example, the common voltage supplying line 70 may be positioned outside the driving circuit unit DV.

The first passivation layer 181 may be positioned on the driving circuit unit DA and the common voltage supplying line 70. A connection electrode 76 may be positioned on the first passivation layer 181. The connection electrode 76 may be positioned on the second data conductive layer. An opening overlapping the common voltage supplying line 70 and the connection electrode 76 may be formed in the first passivation layer 181. The connection electrode 76 may be connected to the common voltage supplying line 70 through the opening.

A second passivation layer 182 and a third passivation layer 183 may be positioned on the connection electrode 76 and the first passivation layer 181.

A second pixel electrode 2191 may be positioned on the third passivation layer 183 in the second display area DA2. An extension electrode 78 may be positioned on the third passivation layer 183 in the peripheral area PA. The extension electrode 78 may be positioned on a same layer as the first pixel electrode 1191 and the second pixel electrode 2191. An opening overlapping the extension electrode 78 and the connection electrode 76 may be formed in the third passivation layer 183 and the second passivation layer 182. The extension electrode 78 may be connected to the connection electrode 76 through the opening. The extension electrode 78 may extend in the first direction DR1 in a plan view. The extension electrode 78 may include openings 781. The first passivation layer 181, the second passivation layer 182, and the third passivation layer 183 positioned below the extension electrode 78 are made of organic materials. The opening 781 of the extension electrode 78 forms a discharge passage of gas coming out of the layer made of an organic material during the manufacturing process, thereby reducing influences applied to other elements.

A bank layer 350 may be positioned on the extension electrode 78, and a spacer 355 may be positioned on the bank layer 350. The bank layer 350 may cover the opening 781 of the extension electrode 78. As the extension electrode 78 may be made of layers, and the bank layer 350 covers the opening 781, so the lateral side of the extension electrode 78 may be prevented from being exposed to the outside. The spacer 355 may cover the opening 781 of the extension electrode 78 in a region. A pattern portion Wall to be described overlaps the extension electrode 78, and some (or a number of) layers of the pattern portion Wall may cover the opening 781 of the extension electrode 78.

The spacer 355 may include a same material or a similar material as the bank layer 350. However, without being limited thereto, the spacer 355 may be made of a material that is different from that of the bank layer 350. The spacer 355 may be an organic insulator including at least one material of a polyimide, a polyamide, an acryl resin, a benzocyclobutene, and a phenol resin. The spacer 355 may be positioned in the display area DA and the peripheral area PA.

An emission layer 370 may be positioned on the bank layer 350 and the spacer 355, and a common electrode 270 may be positioned on the emission layer 370. An encapsulation layer 400 may be positioned on the common electrode 270. The encapsulation layer 400 may include a first inorganic encapsulation layer 410, an organic encapsulation layer 420, and a second inorganic encapsulation layer 430. The organic encapsulation layer 420 may be positioned between the first inorganic encapsulation layer 410 and the second inorganic encapsulation layer 430. The end portions of the first inorganic encapsulation layer 410 and the second inorganic encapsulation layer 430 may contact or directly contact each other in the peripheral area PA.

As shown in FIG. 8, the emission layer 370 may include an individual emission layer 370*c*, and common layers 370*a*, 370*b*, 370*d*, and 370*e* positioned on a lower side or an upper side of the individual emission layer 370*c*.

The individual emission layer 370*c* may include a low-molecule or polymer organic material emitting light such as red, green, and blue light. The substrate 110 may include pixels. The individual emission layer 370*c* may be separated and positioned on the respective pixels. For example, the individual emission layer 370*c* may be positioned in the pixel openings 1351 and 2351. For example, pixels may include a red pixel, a green pixel, and a blue pixel, and the individual emission layer 370*c* including an organic material emitting red light may be positioned on the red pixel. The individual emission layer 370*c* including an organic material emitting green light may be positioned on the green pixel, and the individual emission layer 370*c* including an organic material emitting blue light may be positioned on the blue pixel. The individual emission layers 370*c* including different materials may be positioned on the respective pixels.

The common layers 370*a*, 370*b*, 370*d*, and 370*e* may include an electron injection layer 370*a*, an electron transport layer 370*b*, a hole transport layer 370*d*, and a hole injection layer 370*e*. The electron transport layer 370*b* may be positioned on a lower side of the individual emission layer 370*c*, and the electron injection layer 370*a* may be positioned on the lower side of the electron transport layer 370*b*. The hole transport layer 370*d* may be positioned on the upper side of the individual emission layer 370*c*, and the hole injection layer 370*e* may be positioned on the upper side of the hole transport layer 370*d*. The common layers 370*a*, 370*b*, 370*d*, and 370*e* may be positioned to be connected to each other on the pixels. The common layers 370*a*, 370*b*, 370*d*, and 370*e* may be positioned in the pixel openings 1351 and 2351 and on the bank layer 350 and the spacer 355. At least some of the electron injection layer 370*a*, the electron transport layer 370*b*, the hole transport layer 370*d*, and the hole injection layer 370*e* may be omitted from the common layers 370*a*, 370*b*, 370*d*, and 370*e*. The electron injection layer 370*a* may contact the first pixel electrode 1191 in the first display area DA1, and may contact the second pixel electrode 2191 in the second display area DA2. The hole injection layer 370*e* may contact the common electrode 270.

Another emission layer may be further positioned on the emission layer 370. For example, at least two emission layers 370 may be stacked. A charge generating layer may be positioned among emission layers. The charge generating layer may generate electrons and may work as a cathode for one of the two adjacent emission layers, and it may generate holes and work as an anode for the other thereof. The charge generating layer may include an n-type charge generating layer and a p-type charge generating layer. The n-type charge generating layer and the p-type charge generating layer may be bonded to each other to form an NP junction. By the NP junction, the electrons and the holes may be simultaneously generated between the n-type charge generating layer and the p-type charge generating layer.

At least some of (or a number of) the common layers 370*a*, 370*b*, 370*d*, and 370*e* of the emission layer 370 may be formed by a deposition method using an open mask 510, as shown in FIG. 9. The open mask 510 may include an open portion 512 and a blocking portion 514. In case that the open mask 510 is put on the substrate 110, and materials for forming the common layers 370*a*, 370*b*, 370*d*, and 370*e* are sequentially deposited, a pattern is deposited on the upper side of the substrate 110 corresponding to the open portion 512 of the open mask 510, and no pattern is deposited on the upper side of the substrate 110 corresponding to the blocking portion 514. The open portion 512 of the open mask 510 may correspond to the first display area DA1 and the second display area DA2, and the blocking portion 514 may correspond to the peripheral area PA. The blocking portion 514 may be positioned on respective sides of the open portion 512. Therefore, the emission layer 370 may be generally formed in the first display area DA1 and the second display area DA2. The emission layer 370 may not be formed in the peripheral area PA. The emission layer 370 may be formed around the boundary between the second display area DA2 and the peripheral area PA.

As shown in FIG. 10, the common electrode 270 may be formed by the deposition method using the open mask 520. The open mask 520 may include an open portion 522 and a blocking portion 524. In case that the open mask 520 is put on the substrate 110, and the material for forming the common electrode 270 is deposited, a pattern is deposited on the upper side of the substrate 110 corresponding to the open portion 522 of the open mask 520, and no pattern is deposited on the upper side of the substrate 110 corresponding to the blocking portion 524. The open portion 522 of the open mask 520 may correspond to the first display area DA1, the second display area DA2, and part of the peripheral area PA, and the blocking portion 524 may correspond to the rest of the peripheral area PA. The blocking portion 524 may be positioned on respective sides of the open portion 522. Therefore, the common electrode 270 may be formed in the first display area DA1, the second display area DA2, and a region of the peripheral area PA provided near the second display area DA2. The common electrode 270 may not be formed in the rest of the region of the peripheral area PA. The common electrode 270 may be positioned on the emission layer 370 and may contact the emission layer 370 in the display area DA. The common electrode 270 may be positioned on the bank layer 350, the spacer 355, and the extension electrode 78 in the peripheral area PA. The common electrode 270 may contact the extension electrode 78 in the peripheral area PA. The common electrode 270 may be connected to the extension electrode 78, the extension electrode 78 may be connected to the connection electrode 76, and the connection electrode 76 may be connected to the common voltage supplying line 70. Therefore, the common electrode 270 may be connected to the common voltage supplying line 70 through the extension electrode 78 and the connection electrode 76 and may receive the common voltage ELVSS.

As shown in FIG. 7 and FIG. 11, the display device may further include a pattern portion Wall positioned on the driving circuit unit DV. The pattern portion Wall may be positioned in the peripheral area PA of the substrate 110. Part of the pattern portion Wall may be positioned around the boundary between the second display area DA2 and the peripheral area PA of the substrate 110. The pattern portion Wall may include a first pattern portion Wall1 and a second pattern portion Wall2.

The pattern portion Wall may include a same layer as the first passivation layer 181, a same layer as the second passivation layer 182, a same layer as the third passivation layer 183, a same layer as the bank layer 350, and a same layer as the spacer 355. The pattern portion Wall may include the same layers as the first passivation layer 181, the second passivation layer 182, the third passivation layer 183, the bank layer 350, and the spacer 355, and depending on cases, some of (or a number of) the layers may be omitted. The pattern portion Wall may include a same material or a similar material as the first passivation layer 181, the second passivation layer 182, the third passivation layer 183, the bank layer 350, and the spacer 355. The pattern portion Wall may include same materials or similar materials as the first passivation layer 181, the second passivation layer 182, the third passivation layer 183, the bank layer 350, and the spacer 355, and depending on cases, some of (or a number of) the materials may be omitted.

The first pattern portion Wall1 may overlap the end portion of the emission layer 370. The emission layer forming region REL in which the emission layer 370 is formed may correspond to the open portion 512 of the open mask 510 used in the process for forming an emission layer 370. The emission layer forming region REL may correspond to the first display area DA1 and the second display area DA2. The first pattern portion Wall1 may overlap the boundary between the portion in which the emission layer 370 is formed and the portion in which the same is not formed, for example, the end portion of the emission layer forming region REL. For example, the end portion of the emission layer 370 may be positioned on the first pattern portion Wall1. The end portion of the emission layer 370 may be positioned on the center portion of the upper side of the first pattern portion Wall1. The end portions of the common layers 370*a*, 370*b*, 370*d*, and 370*e* of the emission layer 370 may be positioned on the first pattern portion Wall1.

The first pattern portion Wall1 may have a bar shape or a substantially bar shape extending in the second direction DR2 in a plan view. The first pattern portion Wall1 may be positioned near the edge of the substrate 110. The first pattern portion Wall1 may extend in parallel to the edge of the substrate 110. A width WT1 of the first pattern portion Wall1 may be equal to or greater than about 15 μm and equal to or less than about 50 μm.

The second pattern portion Wall2 may overlap the end portion of the common electrode 270. The common electrode forming region RES in which the common electrode 270 is formed may correspond to the open portion 522 of the open mask 520 used in the process for forming a common electrode 270. The common electrode forming region RES may correspond to the first display area DA1, the second display area DA2, and part of the peripheral area PA. The second pattern portion Wall2 may overlap the boundary between the portion in which the common electrode 270 is formed and the portion in which the same is not formed, for example, the end portion of the common electrode forming region RES. For example, the end portion of the common electrode 270 may be positioned on the second pattern portion Wall2. The end portion of the common electrode 270 may be positioned on the center portion of the upper side of the second pattern portion Wall2.

The second pattern portion Wall2 may have a bar shape or a substantially bar shape extending in the second direction DR2 in a plan view. The second pattern portion Wall2 may be positioned near the edge of the substrate 110. The second pattern portion Wall2 may extend in parallel to the edge of the substrate 110. A width WT2 of the second pattern portion Wall2 may be equal to or greater than about 15 μm, and equal to or less than about 50 μm.

The common electrode forming region RES may have a greater width than that of the emission layer forming region REL. For example, the end portion of the common electrode forming region RES may be positioned nearer the edge of the substrate 110 than the end portion of the emission layer forming region REL is. Therefore, the second pattern portion Wall2 may be positioned nearer the edge of the substrate 110 than the first pattern portion Wall1 is. For example, the second pattern portion Wall2 may be positioned on the outside of the first pattern portion Wall1.

The extension electrode 78 may contact the common electrode 270 in the region between the first pattern portion Wall1 and the second pattern portion Wall2. The extension electrode 78 may overlap the common voltage supplying line 70, the first pattern portion Wall1, and the second pattern portion Wall2. The extension electrode 78 may overlap most of the pattern portion Wall. Here, the extension electrode 78 may not overlap a region of the first pattern portion Wall. For example, the extension electrode 78 may overlap part of the left side of the first pattern portion Wall, and may not overlap part of the right side thereof. The extension electrode 78 may be connected to the common electrode 270 in the region between the first pattern portion Wall1 and the second pattern portion Wall2. To fluently electrically connect the extension electrode 78 and the common electrode 270, a distance SP between the first pattern portion Wall1 and the second pattern portion Wall2 may be, for example, equal to or greater than about 70 μm. The greater the distance SP between the first pattern portion Wall1 and the second pattern portion Wall2 is, it is more advantageous in connection of the extension electrode 78 and the common electrode 270 so there may be no upper restrictions. However, in case that the distance SP between the first pattern portion Wall1 and the second pattern portion Wall2 is very great, the area of the peripheral area PA displaying no screen may be increased.

A first passivation layer 181, a second passivation layer 182, a third passivation layer 183, a bank layer 350, a spacer 355, and a valley from which all of them are removed may be formed between the first pattern portion Wall1 and the second pattern portion Wall2. The extension electrode 78 and the common electrode 270 may be positioned in the valley.

The display device may further include a dam positioned on the substrate 110. The dam may be positioned in the peripheral area PA of the substrate 110. The dam may be positioned nearer the edge of the substrate 110 than the pattern portion Wall is. For example, the dam may be positioned on the outside of the pattern portion Wall. The dam may be positioned on the outside of the second pattern portion Wall2. The second pattern portion Wall2 may be positioned between the first pattern portion Wall1 and the dam. The dam may include a first dam DAM1 and a second dam DAM2.

The dam may include a same layer as the first passivation layer 181, a same layer as the second passivation layer 182, a same layer as the third passivation layer 183, a same layer as the bank layer 350, and a same layer as the spacer 355. The dam may include all the same layers as the first passivation layer 181, the second passivation layer 182, the third passivation layer 183, the bank layer 350, and the spacer 355, and depending on cases, some of (or a number of) the layers may be omitted. The dam may include a same material or a similar material as the first passivation layer 181, the second passivation layer 182, the third passivation layer 183, the bank layer 350, and the spacer 355. The dam may include the same materials or similar materials as the first passivation layer 181, the second passivation layer 182, the third passivation layer 183, the bank layer 350, and the spacer 355, and depending on cases, some of (or a number of) the materials may be omitted.

The first dam DAM1 may overlap the common voltage supplying line 70. The first dam DAM1 may overlap the center portion of the common voltage supplying line 70. The first dam DAM1 may overlap the connection electrode 76. The first dam DAM1 may be positioned on the connection electrode 76. The first dam DAM1 may overlap the extension electrode 78. The first dam DAM1 may include layers, and the extension electrode 78 may be positioned among layers. The extension electrode 78 may be positioned between a same layer as the third passivation layer 183 and a same layer as the bank layer 350.

The second dam DAM2 may be positioned nearer the edge of the substrate 110 than the first dam DAM1 is. For example, the second dam DAM2 may be positioned on the outside of the first dam DAM1. The second dam DAM2 may overlap the edge of the common voltage supplying line 70. The second dam DAM2 may overlap the connection electrode 76 and the extension electrode 78. The second dam DAM2 may include layers, and the connection electrode 76 and extension electrode 78 may be positioned among layers. The connection electrode 76 may be positioned between a same layer as the first passivation layer 181 and a same layer as the second passivation layer 182. The extension electrode 78 may be positioned between a same layer as the third passivation layer 183 and a same layer as the bank layer 350.

The encapsulation layer 400 covers the pattern portion Wall and the dam. The first inorganic encapsulation layer 410 and the second inorganic encapsulation layer 430 of the encapsulation layer 400 may cover the pattern portion Wall and the dam. The organic encapsulation layer 420 of the encapsulation layer 400 may cover the pattern portion Wall. The organic encapsulation layer 420 may cover the upper side and the lateral side of the pattern portion Wall. The organic encapsulation layer 420 may not cover the upper side of the dam. The organic encapsulation layer 420 may cover the lateral side of the first dam DAM1.

An effect caused in case that the display device according to an embodiment may include a pattern portion will now be described with reference to FIG. 12 and FIG. 13.

Figure 12:
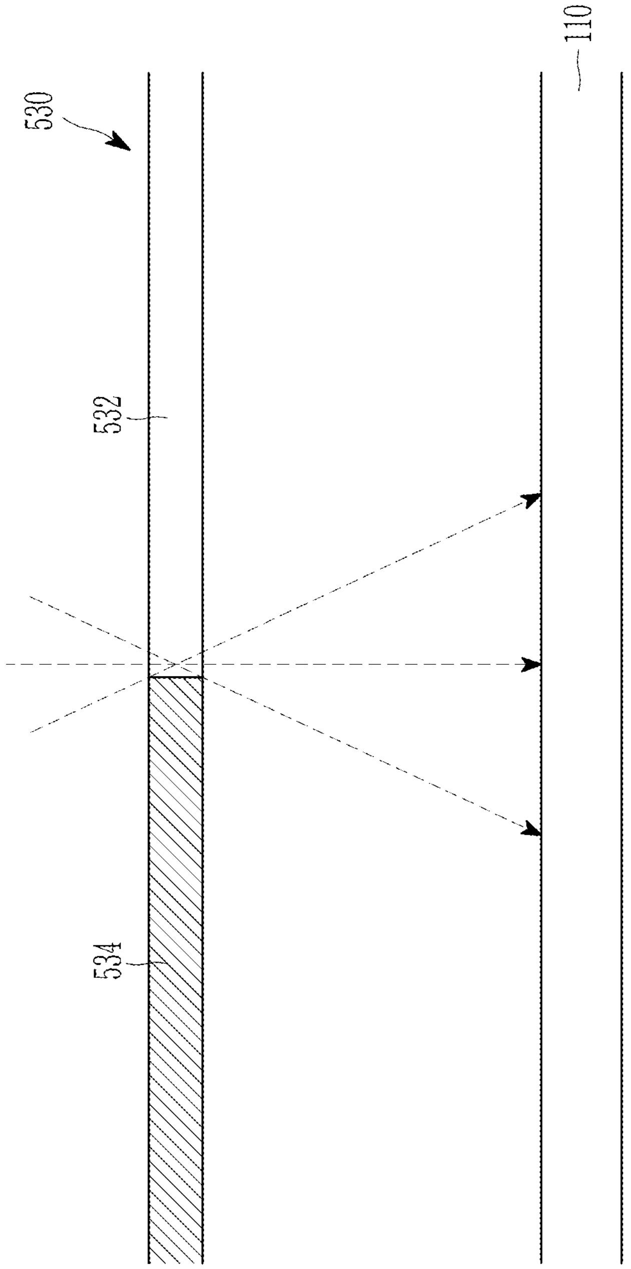
FIG. 12 shows part of a process for manufacturing a display device according to a comparative example.
Figure 13:
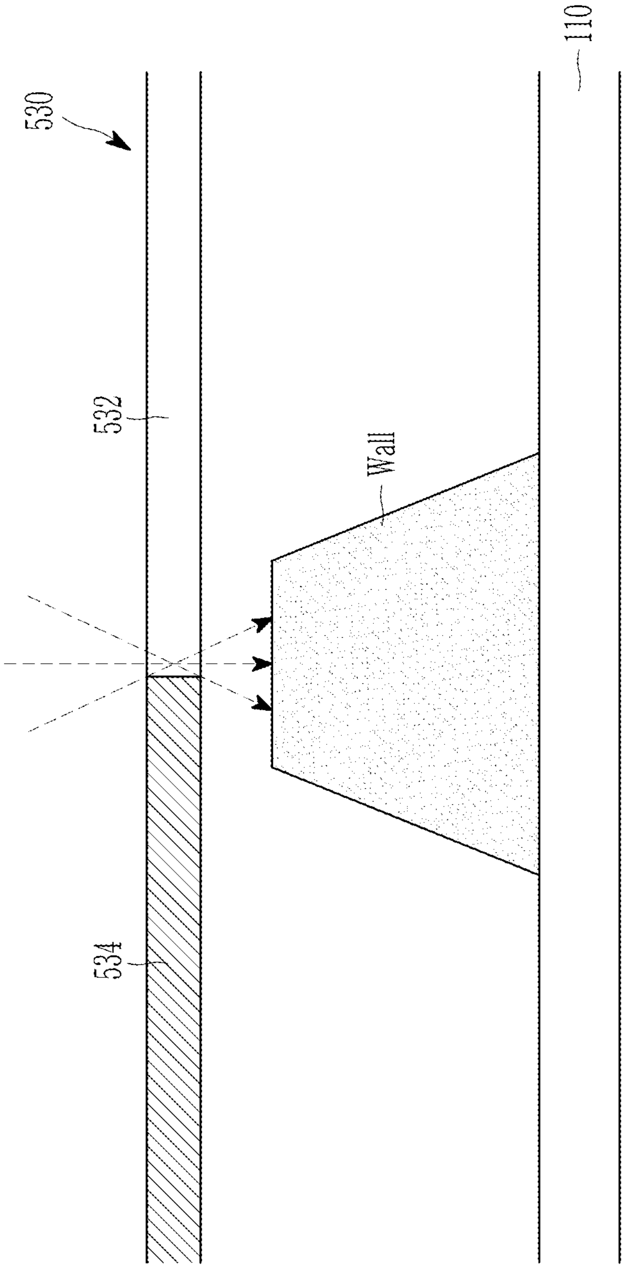
FIG. 13 shows part of a process for manufacturing a display device according to an embodiment.

FIG. 12 shows part of a process for manufacturing a display device according to a comparative example, and FIG. 13 shows part of a process for manufacturing a display device according to an embodiment. FIG. 12 and FIG. 13 omit most of the layers for ease of description, and show a process for forming a layer by using an open mask.

As shown in FIG. 12, an open mask 530 is put on the substrate 110 and a deposition process may be performed to manufacture a display device according to a comparative example. The open mask 530 may include an open portion 532 and a blocking portion 534. A space may be provided between the substrate 110 and the open mask 530, and as the distance between the substrate 110 and the open mask 530 becomes greater, the deposition material may be spread wider. For example, a dissemination of the deposition material is increased. Therefore, the thickness of the layer formed by the deposition process is reduced on the boundary between the open portion 532 and the blocking portion 534, and a layer may be formed on the portion corresponding to the blocking portion 534.

A portion that has the thickness that is equal to or less than about 90% of a target thickness of a layer to be formed by the deposition process may be defined to be a shadow. The common layer of the emission layer and the common electrode may be formed by the deposition method using an open mask. In case that the shadow of the emission layer is increased, the emission layer may be positioned between the common electrode and the extension electrode to hinder the connection between the common electrode and the extension electrode, and the common voltage ELVSS may not be fluently transmitted. In case that the shadow of the common electrode is increased, resistance of the common electrode is increased and the common voltage ELVSS may not be fluently transmitted.

As shown in FIG. 13, to manufacture the display device according to an embodiment, organic films are disposed to overlap each other on the substrate 110 and thereby form a pattern portion Wall, an open mask 530 may be put thereon, and a deposition process may be performed. The pattern portion Wall may be positioned between the substrate 110 and the open mask 530. The pattern portion Wall may be positioned on the boundary between the open portion 532 and the blocking portion 534. The distance between the substrate 110 and the open mask 530 may be reduced by the pattern portion Wall on the boundary between the open portion 532 and the blocking portion 534. Therefore, dissemination of the deposition material may be reduced. The thickness of the layer positioned around the boundary between the open portion 532 and the blocking portion 534 may be equal to the thickness of other portions, and no layer may be formed on the portion corresponding to the blocking portion 534.

Regarding the display device, the shadow of the common layer of the emission layer and the common electrode may be reduced. Hence, the connection between the common electrode and the extension electrode may be stably performed, the increase of resistance of the common electrode may be prevented, and the common voltage ELVSS may be fluently transmitted. To reduce the shadow of the common layer of the emission layer and the common electrode, it is by way of example to form the widths of the first pattern portion and the second pattern portion to be equal to or greater than about 15 μm and equal to or less than about 50 μm.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:

a substrate including a first display area, a peripheral area, and a second display area disposed between the first display area and the peripheral area;

a first light-emitting device disposed on the first display area of the substrate;

a second light-emitting device disposed on the second display area of the substrate;

a scan driver disposed on the second display area and the peripheral area of the substrate and overlapping the second light-emitting device in a plan view;

an electrically insulating patterned wall disposed on the scan driver; and a dam disposed on an outside of the patterned wall.

2. The display device of claim 1, further comprising:

an emission layer disposed on the first display area and the second display area of the substrate; and a common electrode disposed on the emission layer, wherein the patterned wall includes:

an electrically insulating first patterned wall overlapping an end portion of the emission layer in the plan view, and an electrically insulating second patterned wall overlapping an end portion of the common electrode in the plan view.

3. The display device of claim 2, further comprising:

a common voltage supplying line disposed on the peripheral area of the substrate; and an extension electrode electrically connecting the common voltage supplying line to the common electrode, wherein the extension electrode and the common electrode electrically contact each other in a region between the first patterned wall and the second patterned wall.

4. The display device of claim 3, wherein the extension electrode overlaps the common voltage line, the first patterned wall, and the second patterned wall in the plan view.

5. The display device of claim 2, further comprising:

an encapsulation layer disposed on the substrate, wherein the encapsulation layer includes:

a first inorganic encapsulation layer;

a second inorganic encapsulation layer; and an organic encapsulation layer disposed between the first inorganic encapsulation layer and the second inorganic encapsulation layer, and the organic encapsulation layer covers the patterned wall.

6. The display device of claim 5, wherein the organic encapsulation layer covers an upper side and a lateral side of the patterned wall, and the organic encapsulation layer does not cover an upper side of the dam.

7. The display device of claim 6, wherein the dam includes:

a first dam overlapping the common voltage supplying line in the plan view; and a second dam disposed on an outside of the first dam, and the organic encapsulation layer covers a lateral side of the first dam.

8. The display device of claim 6, wherein the first inorganic encapsulation layer and the second inorganic encapsulation layer cover the patterned wall and the dam.

9. The display device of claim 2, wherein a width of the first patterned wall is equal to or greater than about 15 μm and equal to or less than about 50 μm, and a width of the second patterned wall is equal to or greater than about 15 μm and equal to or less than about 50 μm.

10. The display device of claim 2, wherein a distance between the first patterned wall and the second patterned wall is equal to or greater than about 70 μm.

11. The display device of claim 2, wherein the second patterned wall is disposed further outside than the first patterned wall.

12. The display device of claim 2, wherein the second patterned wall is disposed between the first patterned wall and the dam.

13. The display device of claim 2, further comprising:

a first pixel circuit disposed on the first display area of the substrate; and a first pixel electrode electrically connected to the first pixel circuit, wherein the first light-emitting device includes the first pixel electrode, the emission layer, and the common electrode, and a light emitting region of the first light-emitting device overlaps the first pixel circuit electrically connected to the first light-emitting device.

14. The display device of claim 13, further comprising:

a second pixel circuit disposed on the second display area of the substrate; and a second pixel electrode electrically connected to the second pixel circuit, wherein the second light-emitting device includes the second pixel electrode, the emission layer, and the common electrode, and a light emitting region of the second light-emitting device does not overlap the second pixel circuit electrically connected to the second light-emitting device in the plan view.

15. The display device of claim 14, further comprising:

a bank layer disposed on the first pixel electrode and the second pixel electrode, and including a pixel opening overlapping the first pixel electrode and the second pixel electrode in the plan view; and a spacer disposed on the bank layer, wherein the patterned wall, the bank layer, and the spacer include a same material.

16. The display device of claim 15, further comprising:

passivation layers disposed below the first pixel electrode and the second pixel electrode and including an organic material, wherein the patterned wall and the passivation layer include a same material.

17. The display device of claim 2, wherein an end portion of the emission layer is disposed on a center portion of an upper side of the first patterned wall, and an end portion of the common electrode is disposed on a center portion of an upper side of the second patterned wall.

18. The display device of claim 2, wherein the substrate includes pixels, the emission layer includes:

an individual emission layer separated and disposed on respective pixels; and a common layer connected to the pixels, and an end portion of the common layer of the emission layer is disposed on the first patterned wall.

19. The display device of claim 18, wherein the common layer of the emission layer and the common electrode are formed by a deposition method using an open mask.

20. The display device of claim 2, wherein the first patterned wall and the second patterned wall are respectively disposed near an edge of the substrate, and have a bar shape extending in parallel to the edge of the substrate in the plan view.

* * * * *